(12) United States Patent
Schmenn et al.

(10) Patent No.: US 11,916,059 B2
(45) Date of Patent: *Feb. 27, 2024

(54) ELECTRONIC DEVICE

(71) Applicant: Infineon Technologies AG, Neubiberg (DE)

(72) Inventors: Andre Schmenn, Sachsenkam (DE); Stefan Pompl, Landshut (DE); Damian Sojka, Regensburg (DE); Katharina Umminger, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 265 days.

This patent is subject to a terminal disclaimer.

(21) Appl. No.: 17/411,060

(22) Filed: Aug. 25, 2021

(65) Prior Publication Data
US 2022/0045046 A1 Feb. 10, 2022

Related U.S. Application Data

(60) Continuation of application No. 16/783,188, filed on Feb. 6, 2020, now Pat. No. 11,127,733, which is a (Continued)

(30) Foreign Application Priority Data

Oct. 4, 2016 (DE) ...................... 10 2016 118 709.7

(51) Int. Cl.
*H01L 23/60* (2006.01)
*H01L 27/02* (2006.01)
(Continued)

(52) U.S. Cl.
CPC .......... *H01L 27/0248* (2013.01); *H01L 21/78* (2013.01); *H01L 23/5386* (2013.01); (Continued)

(58) Field of Classification Search
CPC ............. H01L 27/0248; H01L 23/5386; H01L 23/5389; H01L 23/60; H01L 25/072; (Continued)

(56) References Cited

U.S. PATENT DOCUMENTS 6,180,426 B1 * 1/2001 Lin .................... G01R 31/2884
257/E21.705
10,622,346 B2 * 4/2020 Schmenn ................ H01L 24/82
(Continued)

*Primary Examiner* — Eugene Lee
(74) *Attorney, Agent, or Firm* — Viering, Jentschura & Partner mbB

(57) ABSTRACT

An ESD protection device may include: a first vertically integrated ESD protection structure comprising a first semiconductor portion, a first contact region disposed on a first side of the first semiconductor portion and a first terminal exposed on a second side of the first semiconductor portion opposite the first side of the first semiconductor portion, a second vertically integrated ESD protection structure comprising a second semiconductor portion, a second contact region disposed on a first side of the second semiconductor portion and a second terminal exposed on a second side of the second semiconductor portion opposite the first side of the second semiconductor portion, an electrical connection layer, wherein the first vertically integrated ESD protection structure and the second vertically integrated ESD protection structure are disposed on the electrical connection layer laterally separated from each other and are electrically connected with each other anti-serially via the electrical connection layer.

18 Claims, 21 Drawing Sheets

Related U.S. Application Data division of application No. 15/719,599, filed on Sep. 29, 2017, now Pat. No. 10,622,346.

(51) Int. Cl.

| | |
|---|---|
| *H01L 21/78* | (2006.01) |
| *H01L 23/538* | (2006.01) |
| *H01L 23/00* | (2006.01) |
| *H01L 25/07* | (2006.01) |
| *H01L 25/00* | (2006.01) |
| *H01L 29/74* | (2006.01) |
| *H02H 9/04* | (2006.01) |
| *H01L 27/07* | (2006.01) |

(52) U.S. Cl.
CPC .......... H01L 23/5389 (2013.01); H01L 23/60 (2013.01); H01L 24/19 (2013.01); H01L 24/20 (2013.01); H01L 24/97 (2013.01); H01L 25/072 (2013.01); H01L 25/50 (2013.01); H01L 27/0255 (2013.01); H01L 27/0262 (2013.01); H01L 27/0292 (2013.01); H01L 29/7416 (2013.01); H02H 9/04 (2013.01); *H01L 27/0744* (2013.01); *H01L 29/74* (2013.01); *H01L 2224/214* (2013.01); *H01L 2224/95001* (2013.01); *H01L 2924/1203* (2013.01); *H01L 2924/1301* (2013.01); *H01L 2924/30205* (2013.01)

(58) Field of Classification Search
CPC ............. H01L 27/0255; H01L 27/0262; H01L 27/0292; H01L 29/7416; H01L 27/0744
See application file for complete search history.

(56) References Cited

U.S. PATENT DOCUMENTS

| | | | |
|---|---|---|---|
| 11,127,733 B2* | 9/2021 | Schmenn | H01L 23/5389 |
| 2012/0061804 A1* | 3/2012 | Kaskoun | H01L 21/76898 |
| | | | 257/E21.705 |
| 2012/0309128 A1* | 12/2012 | Janzen | H01L 23/62 |
| | | | 257/E21.586 |
| 2014/0035091 A1* | 2/2014 | Smith | H01L 27/0255 |
| | | | 257/499 |
| 2016/0268245 A1* | 9/2016 | Chen | H01L 27/0248 |
| 2016/0300827 A1* | 10/2016 | Vendt | H01L 29/861 |
| 2017/0025402 A1* | 1/2017 | Opoczynski | H01L 29/0684 |

\* cited by examiner

- 110m: Providing a semiconductor carrier, the semiconductor carrier comprising a first vertically integrated electronic structure and a second vertically integrated electronic structure laterally spaced apart from each other, wherein an electrical connection layer is disposed over a first side of the semiconductor carrier electrically connecting the first vertically integrated electronic structure and the second vertically integrated electronic structure with each other

- 120m: Mounting the semiconductor carrier on a support carrier, wherein the first side of the semiconductor carrier faces the support carrier

- 130m: Thinning the semiconductor carrier from a second side opposite the first side

- 140m: Removing material of the semiconductor carrier in a separation region between the first vertically integrated electronic structure and the second vertically integrated electronic structure to separate a first semiconductor region of the first vertically integrated electronic structure from a second semiconductor region of the second vertically integrated electronic structure with the first vertically integrated electronic structure and the second vertical vertically integrated electronic structure remaining electrically connected with each other via the electrical connection structure

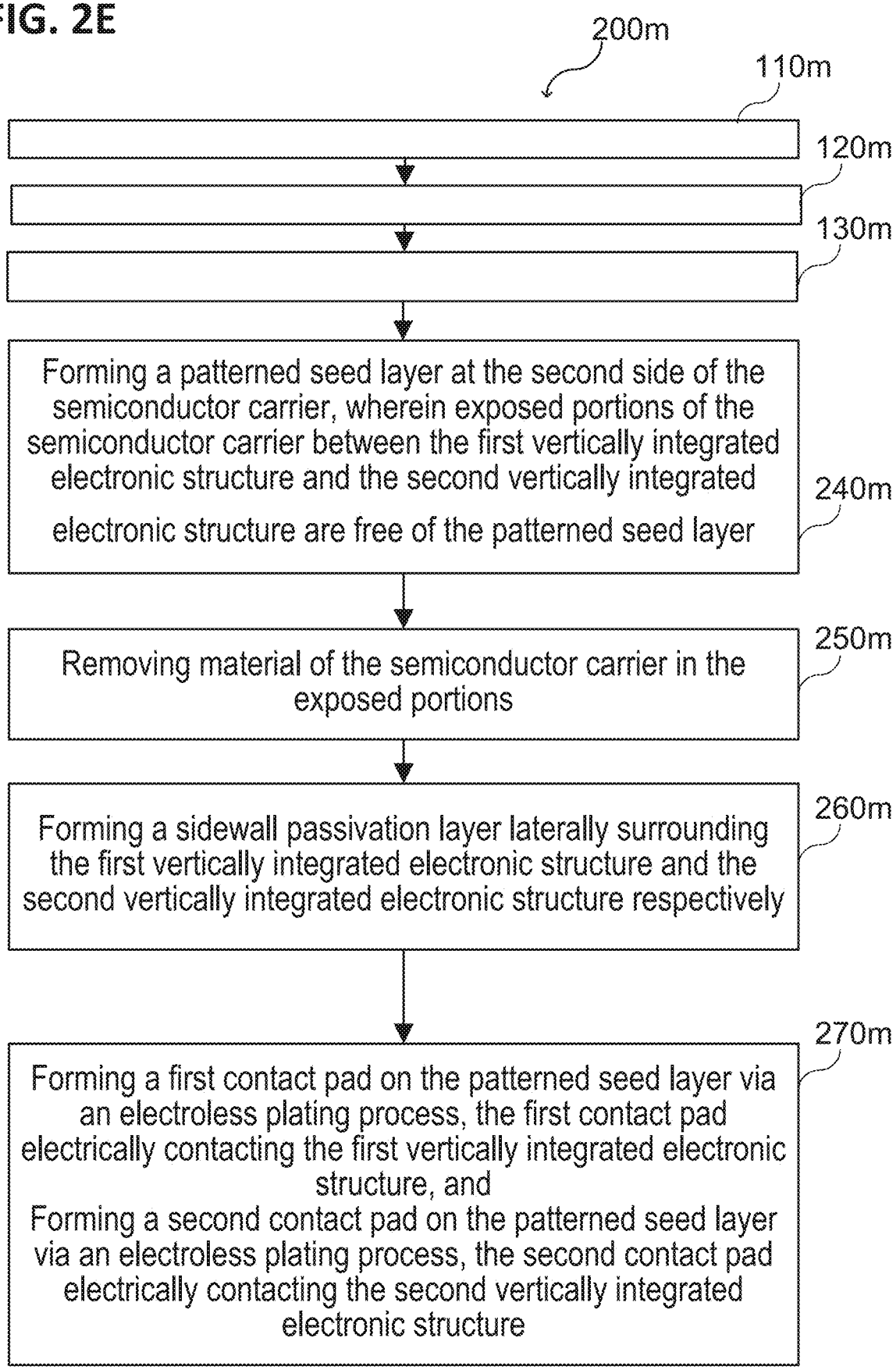

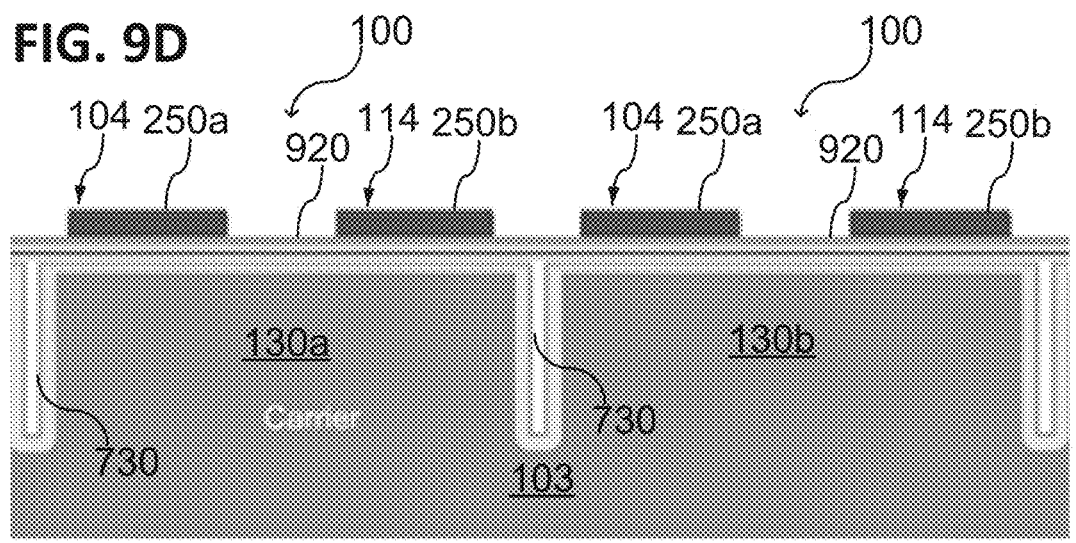
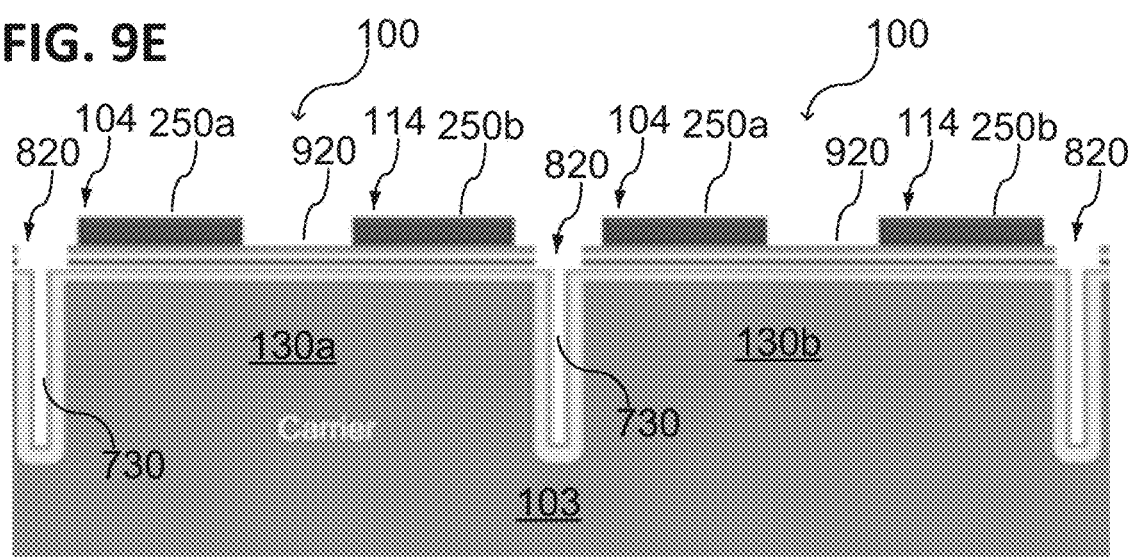
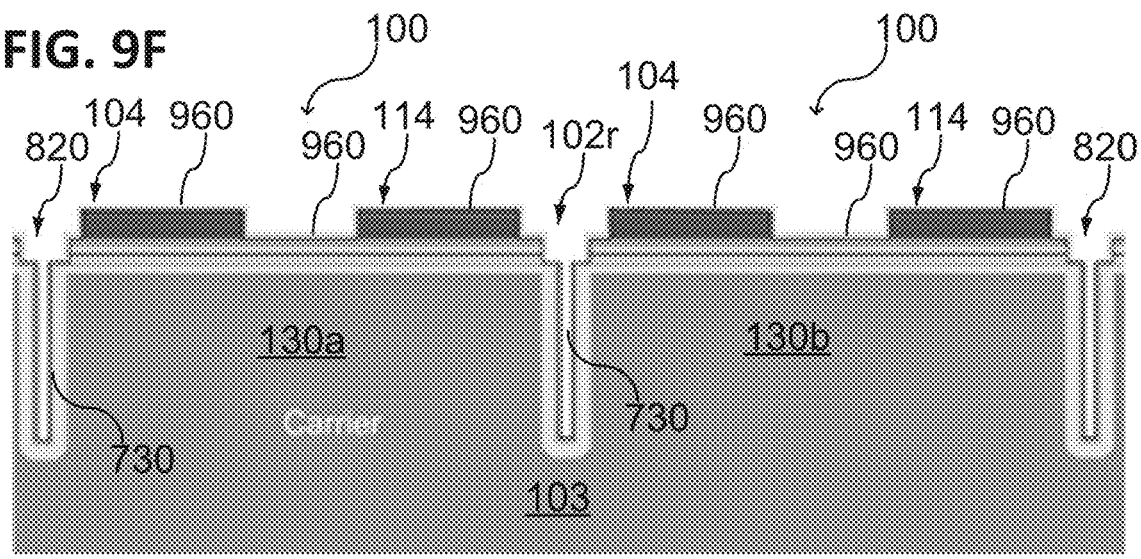

ELECTRONIC DEVICE

CROSS-REFERENCE TO RELATED APPLICATION

This application is a continuation application of U.S. application Ser. No. 16/783,188, filed on Feb. 6, 2020, which is a divisional application of U.S. patent application Ser. No. 15/719,599 which was filed Sep. 29, 2017 and claims priority to German Patent Application Serial No. 10 2016 118 709.7, which was filed Oct. 4, 2016, each of which are incorporated herein by reference in their entirety.

TECHNICAL FIELD

Various embodiments relate generally to a method for manufacturing an electronic device, e.g. a method for manufacturing an electrostatic discharge protection device, and an electronic device, e.g. an electrostatic discharge protection device.

BACKGROUND

In general, forming an electronic device may include various aspects, e.g. due to applied semiconductor processing techniques, that may define a for example minimal size, e.g. a minimal possible thickness, for the device. Illustratively, not only electrical but also mechanical properties have to be considered during manufacturing of an electronic device, since for example a wafer, dies or chips have to be handled during manufacturing. Further, protection devices may be needed in semiconductor technology to provide protection against electrostatic discharge (ESD). Diodes, transistors, and/or thyristors may be used in conventional protection devices. ESD concepts may be provided on laterally integrated devices as well as on vertically integrated devices. Several test and simulation methods can be used for testing the susceptibility of an electronic device to ESD. The so called Human Body Model (HBM) may be used for testing ESD generated from human contact. Other ESD test models may be the Machine Model (MM), the System Level Model and the Charged-Device Model. The test may include discharging a charged capacitor through a resistor into an electrical terminal of the device under test. The test may be carried out according to the several commonly used ESD testing standards, as for example JEDEC 22-A114-B; IEC/EN 61000-4-2, ISO 10605, MIL-STD-883 Method 3015, and the ESD Association's ESD STM5.1. The ESD testing standards respectively specify a capacitance of the capacitor (e.g. 100 pF or 150 pF) and a resistance of the resistor (e.g. 1500Ω or 330Ω) used for testing the devices. However, other tests referring to similar standards may be applied.

SUMMARY

According to various embodiments, a method for manufacturing an electronic device may include: providing a semiconductor carrier, the semiconductor carrier including a first vertically integrated electronic structure and a second vertically integrated electronic structure laterally spaced apart from each other, an electrical connection layer disposed over a first side of the semiconductor carrier and electrically connecting the first vertically integrated electronic structure and the second vertically integrated electronic structure with each other; mounting the semiconductor carrier on a support carrier with the first side of the semiconductor carrier facing the support carrier; thinning the semiconductor carrier from a second side of the semiconductor carrier opposite the first side; removing material of the semiconductor carrier in a separation region between the first vertically integrated electronic structure and the second vertically integrated electronic structure to separate a first semiconductor region of the first vertically integrated electronic structure from a second semiconductor region of the second vertically integrated electronic structure with the first vertically integrated electronic structure and the second vertically integrated electronic structure remaining electrically connected with each other via the electrical connection layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1F shows a schematic flow diagram of a method for manufacturing an electronic device, according to various embodiments;

FIG. 2E shows a schematic flow diagram of a method for manufacturing an electronic device, according to various embodiments;

FIGS. 9A to 9H respectively show an electrostatic discharge protection device at various stages during manufacturing in a schematic cross-sectional view, according to various embodiments.

DESCRIPTION

Figure 1A:
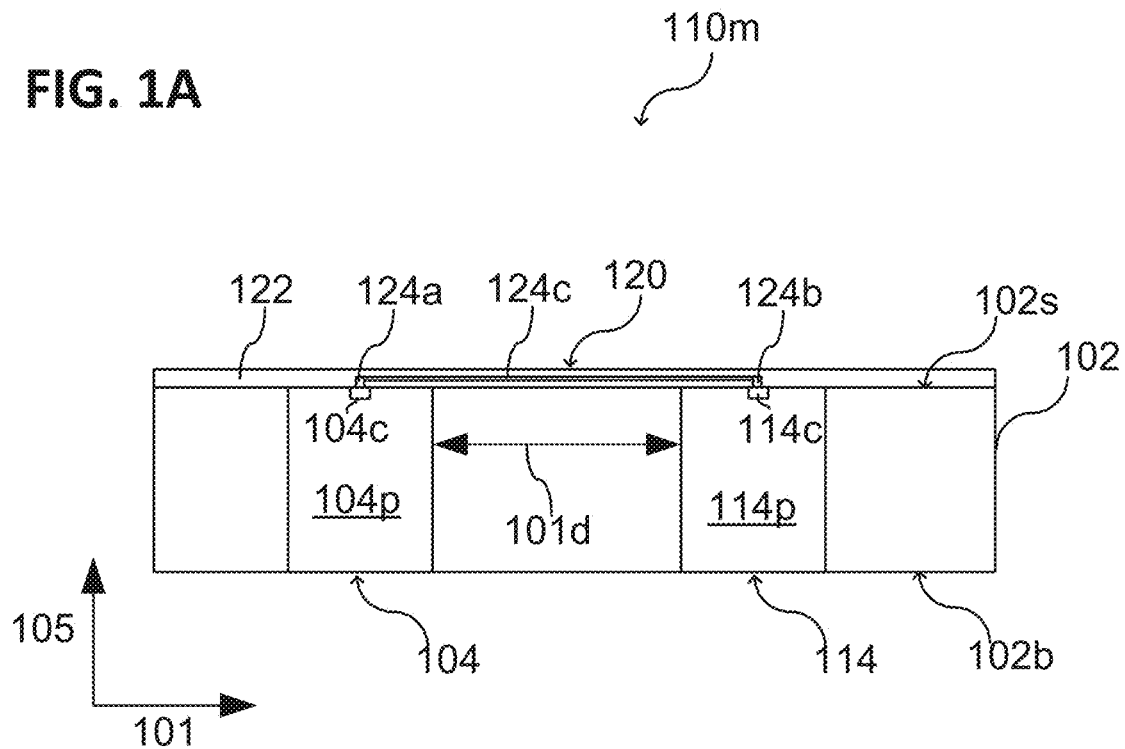
FIGS. 1A to 1E respectively show an electronic device at various stages during manufacturing in a schematic cross-sectional view, according to various embodiments.

The following detailed description refers to the accompanying drawings that show, by way of illustration, specific details and embodiments in which the invention may be practiced.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure provided on or in a carrier (e.g. a layer, a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure may be used herein to mean the lateral extension of a structure. Further, the term "height" used with regards to a height of a structure, may be used herein to mean an extension of a structure along a direction perpendicular to the surface of a carrier (e.g. perpendicular to the main processing surface of a carrier). Further, the term "depth" used with regards to a depth of a structure (e.g. a region), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "coupled" is used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between two terminals, two contacts, etc. may be understood as an electrically conductive connection with ohmic behavior, e.g. provided by a metal or degenerate semiconductor (e.g. in absence of any interfering pn-junction in the current path). The term "contacted" that is used herein to describe an electrical contact between an electrical connection layer (e.g. a metallization) and a semiconductor contact region, or the like, may be understood as direct physical and/or direct electrical contact.

The term "region" used with regards to a "doped region", a "contact region", and the like, may be used herein to mean a continuous region of a single doping type. Different regions disposed within a carrier (e.g. within a semiconductor layer) may be identified and/or distinguished from the carrier based on their doping type and/or doping concentration.

According to various embodiments, a semiconductor carrier (e.g. a semiconductor substrate, a semiconductor wafer, a deposited semiconductor layer, an epitaxial semiconductor layer, and the like) may be made of or may include silicon. According to various embodiments, a semiconductor portion or semiconductor region may be made of or may include silicon. However, other semiconductor materials of various types may be used in a similar way, e.g. germanium, Group III to V (e.g. SiC), or other types, including for example polymers. In an embodiment, the semiconductor carrier is a wafer made of silicon (e.g. p-type doped or n-type doped). In an alternative embodiment, the semiconductor carrier is a silicon on insulator (SOI) wafer.

The terms "first doping type" and "second doping type" may be used herein to mean opposite doping types. The first doping type may be n-type and the second doping type may be p-type. Vice versa, the first doping type may be p-type and the second doping type may be n-type.

The term "vertical" used with regards to a "vertical" electronic structure (e.g. a vertical thyristor structure or a vertical device) may be used herein to mean that an electrical current, e.g. an ESD current, may flow substantially vertically through the electronic structure, e.g. from a first side of the electronic structure to a second side of the electronic structure opposite the first side. In a similar way, a vertically integrated structure may provide a substantially vertical current flow through the vertically integrated structure. A vertically integrated structure may be formed over and/or in a semiconductor carrier.

The term "protection structure" used with regards to an electrostatic discharge "protection structure" may be used herein to mean that the protection structure may have at least two terminals, e.g. two electrical contacts, for coupling the protection structure to an electronic device to be protected.

An electronic device to be protected may include an electronic circuit, and, for example, a first bus (e.g. a supply bus) and a second bus (e.g. a ground bus) to operate the electronic circuit. The protection structure may be coupled between the first bus and the second bus, e.g. in parallel to the electronic circuit, to divert an ESD current through the protection structure. An electronic device to be protected may also have an Input/Output-(I/O)-pad coupled to the electronic circuit, wherein the protection structure may be coupled to the I/O-pad, e.g. between the I/O-pad and at least one bus, to divert an ESD current through the protection structure. The ESD protection structure may be configured to allow a substantial current flow through the protection structure only in case of an ESD event to not influence the default operation of the electronic device.

In general, the employment of powerful interfaces, such as a universal serial bus (USB) 3.1, a high-definition multimedia interface (HDMI), or a Thunderbolt, may lead to increasing requirements of the electrostatic discharge protection device (ESD protection device). In order to maintain an optimum protection in case of an electrostatic discharge, the intrinsic resistance of the protection device needs to be minimized. On the other hand the capacitance can be minimized to protect signal integrity. For a conventional device that includes for example plastic packages the wafer thickness, and therefore the reduction of intrinsic resistance, may be limited.

However, a small thicknesses (e.g. less than for example 15 μm) may be ideal for some kind of electronic devices, wherein such a small thickness may not yet controllable by means of conventional manufacturing methods within a volume production. The main difficulties of conventional methods regarding ultrathin silicon wafers may be silicon split-offs during the wafer/chip dicing (e.g. during sawing) and/or fissures in the silicon single crystal caused by means of applying a force (e.g. a pressure) such as by means of a pick-and-place process (e.g. during the die attaching).

For vertical electronic devices in chip-scale packages (CSP) the electrical path between device and I/O-Pins may be easily realized via the substrate but with a high intrinsic resistance. Metal connection within the substrate may be difficult to achieve and/or may be expensive. In chip-scale packages the I/O pins may be coupled via the substrate. Therefore a low capacitance is only possible using very thick dielectric layers between the active device/substrate and the I/O pins. This may be also difficult to manufacture and/or expensive.

According to various embodiments, a permanent carrier system is used for the active semiconductor (e.g. silicon) device. This concept may enable a decoupling between the I/O pins, a low resistance connection between I/O pins and the active semiconductor device via metal and extremely thin active semiconductor portion to reduce intrinsic resistance of the active semiconductor device. According to various embodiments, almost all parasitic resistances and capacitances may be avoided and, therefore, the pure device performance can be achieved for the final electronic device. The process flow provided herein, according to various embodiments, may be very cost effective. The process flow combines outstanding performance with low cost production. The process flow may be described herein exemplarily for a thyristor/diode device, e.g. a thyristor/diode ESD protecting device, however, it can be applied or easily adapted for any other type of vertical device.

According to various embodiments, FIGS. 1A to 1E illustrate an electronic device 100 at various stages during manufacture, e.g. during method 100m is carried out as illustrated in FIG. 1F in a schematic flow diagram, according to various embodiments.

According to various embodiments, the method 100m for manufacturing an electronic device 100 may include: in 110m (cf. FIG. 1A), providing a semiconductor carrier 102, the semiconductor carrier 102 including a first vertically integrated electronic structure 104 and a second vertically integrated electronic structure 114 laterally spaced apart 101d from each other, and an electrical connection layer 120 disposed at a first side 102s of the semiconductor carrier 102, the electrical connection layer 120 electrically connecting the first vertically integrated electronic structure 104 and the second vertically integrated electronic structure 114 with each other; in 120m (cf. FIG. 1B), mounting the semiconductor carrier 102 on a support carrier 130, the first side 102s of the semiconductor carrier 102 faces the support carrier 130; in 130m (cf. FIG. 1C), thinning the semiconductor carrier 102 from a second side 102r opposite the first side 102s; and, in 140m (cf. FIG. 1D), removing material of the semiconductor carrier 102 in a separation region 140 between the first vertically integrated electronic structure 104 and the second vertically integrated electronic structure 114 to separate a first semiconductor region 104p of the first vertically integrated electronic structure 104 from a second semiconductor region 114p of the second vertically integrated electronic structure 114. The first vertically integrated electronic structure 104 and the second vertically integrated electronic structure 114 remain electrically connected with each other via the electrical connection layer 120. The electrical connection layer 120 may be or may include a metallization layer and/or a patterned layer of any suitable electrically conductive material, e.g. including or consisting of a metal (e.g. aluminum, copper, etc.), a metal alloy (e.g. AlCu), a doped (e.g. degenerated) semiconductor (e.g. very highly doped silicon), and the like. The metallization layer may include for example an aluminum and/or copper metallization.

As illustrated for example in FIG. 1A in a schematic cross-sectional view, according to various embodiments, an electrical connection layer 120 (e.g. a metallization layer) may include at least one first via 124a (or any other electrical connection structure) embedded in dielectric material 122. The at least one first via 124a may electrically contact at least one first contact region 104c of the first vertically integrated electronic structure 104. Further, the electrical connection layer 120 (e.g. the metallization layer) may include at least one second via 124b (or any other electrical connection structure) embedded in dielectric material 122. The at least one second via 124b may electrically contact at least one second contact region 114c of the second vertically integrated electronic structure 114. The at least one first contact region 104c and the at least one second contact region 114c may include highly doped semiconductor material. In other words, the semiconductor carrier 102 may include at least one a highly doped contact region 104c, 114c for each of the vertically integrated electronic structures 104, 114.

According to various embodiments, the electrical connection layer 120 (e.g. the metallization layer) may include one or more metal lines 124c (or any other electrical connection structure) embedded in dielectric material. The one or more metal lines 124c may electrically connect the first vertically integrated electronic structure 104 and the second vertically integrated electronic structure 114 with each other. In other words, the one or more metal lines 124c may electrically connect the at least one first via 124a and the at least one second via 124b with each other (cf. FIG. 1A).

Illustratively, the spatially separated vertically integrated electronic structures 104, 114 are connected to a single electronic device via the electrical connection layer 120 (e.g. via a metallization layer, via electrically conductive polysilicon, etc.). The vertically integrated electronic structures 104, 114 may be provided as thin as possible or as thin as desired. Therefore, to provide mechanical stability during and after manufacturing, the semiconductor carrier 102 is mounted to a support carrier 130 (cf. FIG. 1B).

According to various embodiments, the support carrier 130 may include one or more electronic structures. The one or more electronic structures of the support carrier 130 may be electrically conductively connected to the vertically integrated electronic structures 104, 114 of the semiconductor carrier 102 via the electrical connection layer 120, e.g. via a patterned highly doped polysilicon layer. According to various embodiments, one or more additional electronic structures (e.g. one or more lateral devices) may be formed between the vertically integrated electronic structures 104, 114.

Figure 1B:
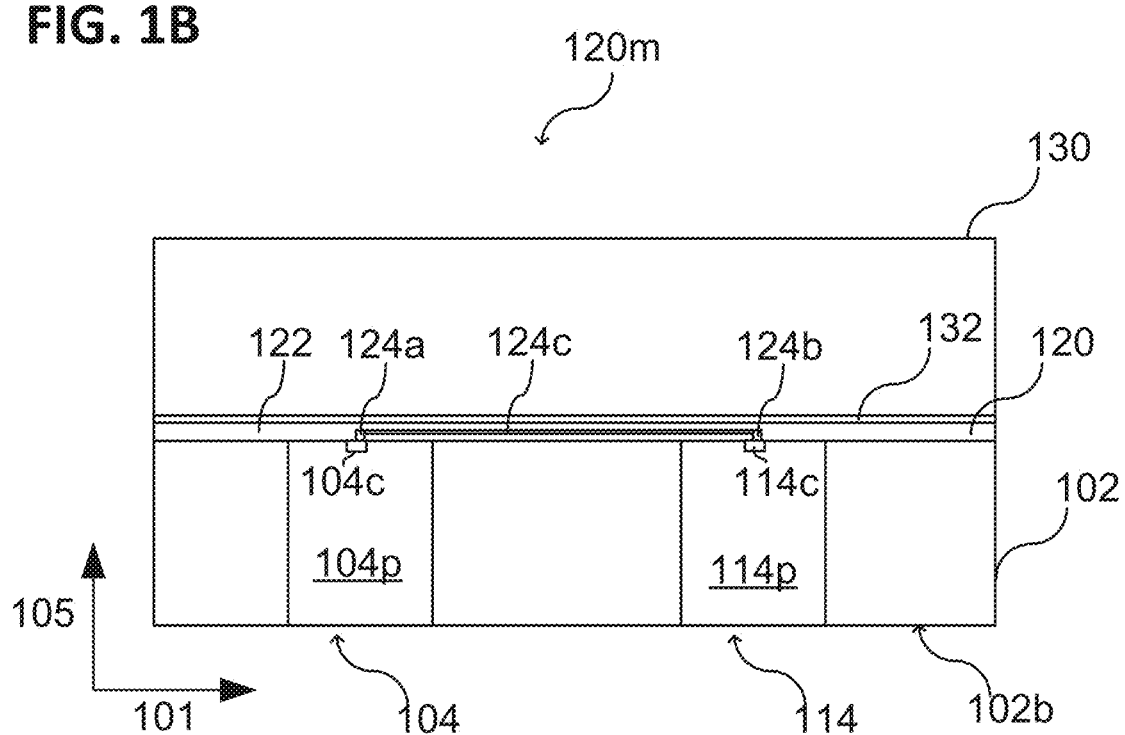

As illustrated for example in FIG. 1B in a schematic cross-sectional view, according to various embodiments, the semiconductor carrier 102 may be mounted on the support carrier with the electrical connection layer 120 facing the support carrier 130. Therefore, an access to the second side 102b of the semiconductor carrier 102 is provided for the further processing. Illustratively, the semiconductor carrier 102 may be readily processed on the first side 102s. Therefore, also the electrical connection layer 120 may be readily processed when the semiconductor carrier 102 is mounted to the support carrier 130. According to various embodiments, a mounting tape 132 or any suitable adhesive layer may be used to bond the semiconductor carrier 102 to the support carrier 130. The mounting tape 132 (or any suitable adhesive layer) may be disposed between the semiconductor carrier 102 and the support carrier 130, i.e. between the electrical connection layer 120 and the support carrier 130. According to various embodiments, the semiconductor carrier 102 may be mounted to the support carrier 130 via any suitable bonding technique, e.g. via direct bonding.

The support carrier may allow removing regions of the semiconductor carrier 102 that are not necessary for the electrical functioning of the vertically integrated electronic structures 104, 114 to thereby reduce for example parasitic capacitance. Therefore, the semiconductor carrier 102 may be thinned (cf. FIG. 1C) and afterwards at least one portion of the semiconductor carrier 102 between the vertically integrated electronic structures 104, 114 may be removed (cf. FIG. 1D).

Figure 1C:
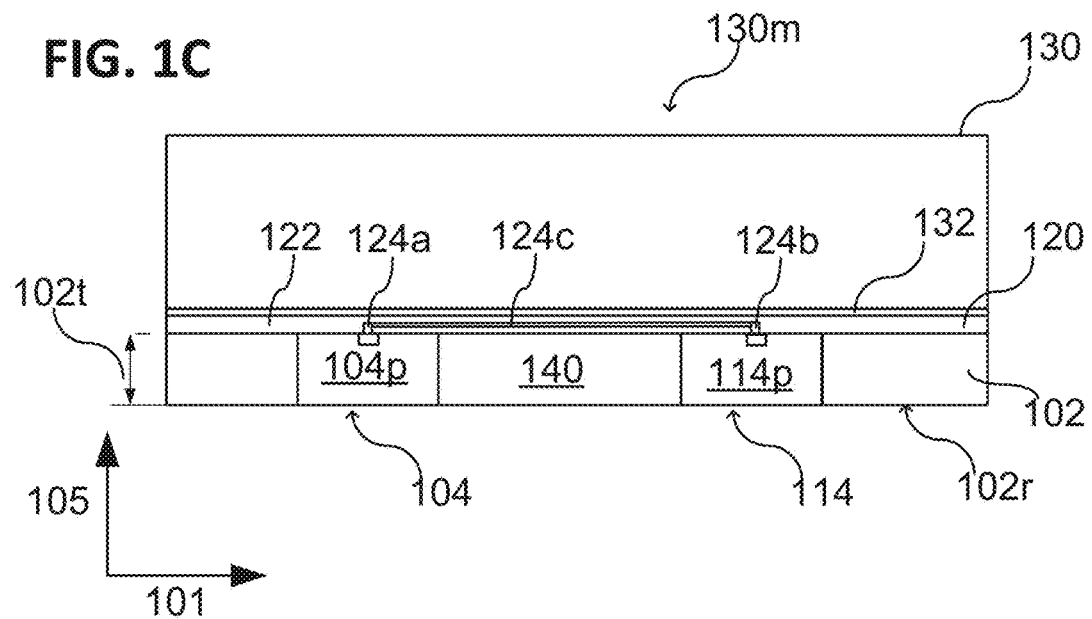

As illustrated for example in FIG. 1C in a schematic cross-sectional view, according to various embodiments, the semiconductor carrier 102 may be thinned from the second side (also referred to as the backside of the semiconductor carrier 102). Thinning the semiconductor carrier may include polishing (also referred to as grinding) the semiconductor carrier from the second side 102r or any other suitable process (for example wet etching or plasma dicing) to remove material of the semiconductor carrier 102. After the thinning process has been carried out, the semiconductor carrier 102 may have a thickness 102t of less than about 15 µm, e.g. about 10 µm, e.g. in the range from about 1 µm to about 15 µm.

Since the electrical current flow in a vertically integrated electronic structure 104, 114 is substantially directed vertically through the respective semiconductor region 104p, 114p, reducing the thickness of the semiconductor carrier 102 may provide a low electrical resistance for the vertically integrated electronic structures 104, 114.

Figure 1D:
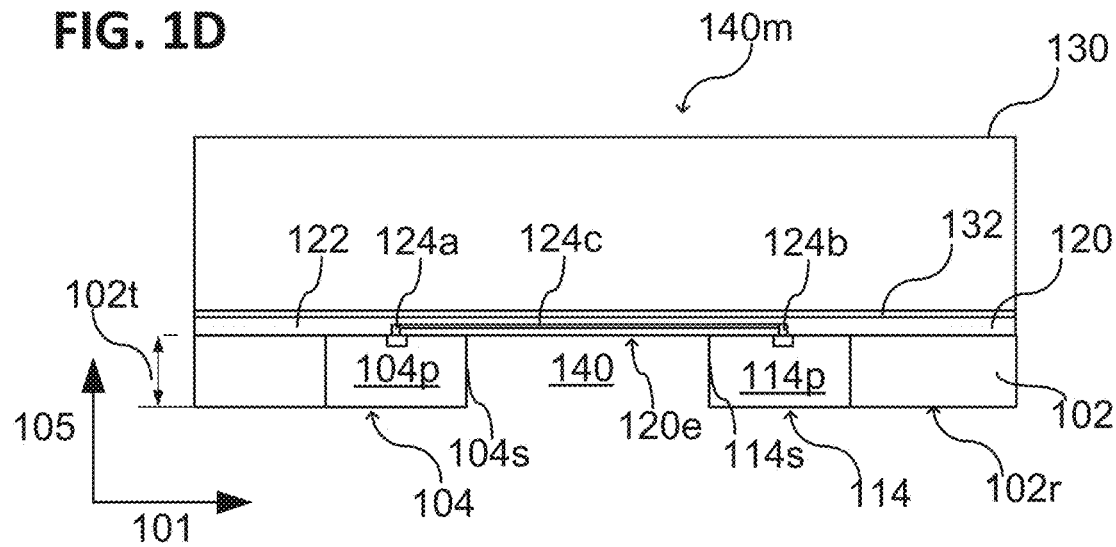

As illustrated for example in FIG. 1D in a schematic cross-sectional view, according to various embodiments, at least a portion of the semiconductor carrier 102 between the vertically integrated electronic structures 104, 114 is removed. Illustratively, the vertically integrated electronic structures 104, 114 are provided in the semiconductor carrier 102 in such a way that a separation region 140 is provided between the vertically integrated electronic structures 104, 114. The separation region 140 may not have an electrical function. However, if the separation region 140 includes for example semiconductor material (e.g. silicon, with a relative permittivity of about 3.6) a substantial contribution to a parasitic capacitance is caused by the separation region 140. Therefore, this region may be at least partially, e.g. completely, removed. Since the vertically integrated electronic structures 104, 114 shall function together as a single device the electrical connection layer may not be removed. The separation region 140 may be removed via an etch process. The separation region 140 may remain free of any solid material to provide a low relative permittivity (e.g. about 1) in the separation region 140. However, if the separation region 140 is filled again with a solid material, a low-k dielectric material may be used, for example with a relative permittivity less than about 3.

According to various embodiments, the electrical connection layer 120 may be at least partially exposed 120e by removing the separation region 140 between the vertically integrated electronic structures 104, 114. Therefore, the parasitic capacitance of the at least one metal line 124c of the electrical connection layer 120 that connects the vertically integrated electronic structures 104, 114 with each other may be reduced. Further, at least one sidewall 104s, 114s of each vertically integrated electronic structure 104, 114 may be exposed by removing the separation region 140.

According to various embodiments, the material of the semiconductor carrier 102 next to the vertically integrated electronic structures 104, 114 may be completely removed. In this case, the vertically integrated electronic structures 104, 114 may be mechanically supported by the electrical connection layer 120 and by the support carrier 130.

Figure 1E:
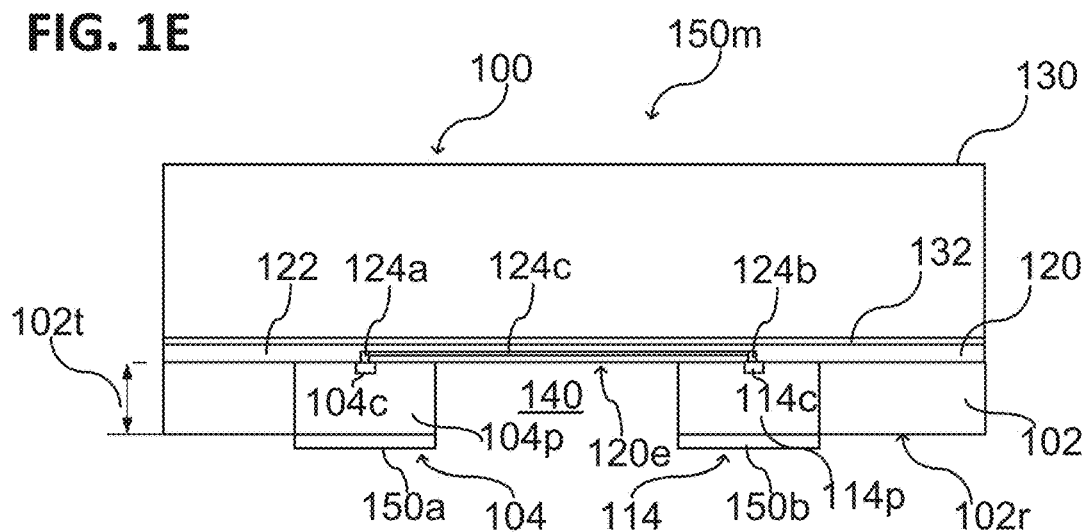

As illustrated for example in FIG. 1E in a schematic cross-sectional view, according to various embodiments, after thinning the semiconductor carrier 102, a first contact structure 150a may be formed on the second side 102r of the semiconductor carrier 102 to electrically contact the first vertically integrated electronic structure 104. Further, a second contact structure 150b may be formed on the second side 102r of the semiconductor carrier 102 to electrically contact the second vertically integrated electronic structure 114, e.g. in a further process 150m of method 100m.

According to various embodiments, the contact structures 150a, 150b may provide the terminals for operating the vertically integrated electronic structures 104, 114, i.e. the terminals for operating the electronic device 100. As described herein, during operation of the electronic device 100, the electrical current may substantially flow vertically thought the semiconductor regions 104p, 114p (also referred to as semiconductor portions) of the vertically integrated electronic structures 104, 114 that are connected with each other by the electrical connection layer 120.

Since the first side of the semiconductor carrier 102, and therefore the first side of the vertically integrated electronic structures 104, 114, is readily processed before the semiconductor carrier 102 is mounted on the support carrier 130, the processing of the second side of the semiconductor carrier 102 is easy and cost efficient. The vertically integrated electronic structures 104, 114 may remain on the support carrier 130.

According to various embodiments, the vertically integrated electronic structures 104, 114 may not be connected to each other by semiconductor material of the semiconductor carrier 102, therefore, providing a minimal parasitic capacitance. According to various embodiments, the first contact structure 150a may have substantially the same (for example with a deviation of less than 50%, e.g. less than 40%, less than 30%, less than 20%, or even less than 10%) lateral extension (along the lateral direction 101 perpendicular to the vertical direction 105) as the first semiconductor region 104p of the first vertically integrated electronic structure 104. Further, the second contact structure 150b may have substantially the same lateral extension as the second semiconductor region 114p of the second vertically integrated electronic structure 114. Unnecessary material of the semiconductor carrier 102, e.g. material of the semiconductor carrier 102 that is not covered by the contact structures 150a, 150b or material of the semiconductor carrier 102 next to the semiconductor regions 104p, 114p, may be removed. According to various embodiments, the lateral dimensions of the semiconductor regions 104p, 114p may be defined by the contact structures 150a, 150b.

The support carrier 130 may include or may be a glass (e.g. including silicon oxide) carrier, a silicon wafer or any other suitable support carrier.

Various modifications and/or configurations of the electronic device 100 and details referring to the method 100m for manufacturing the electronic device 100 are described in the following, wherein the features and/or functionalities described referring to FIGS. 1A to 1F may be included analogously. Further, the features and/or functionalities described in the following may be included in and/or combined with the electronic device 100 or the method 100m, as described before referring to FIGS. 1A to 1F.

Figure 2A:
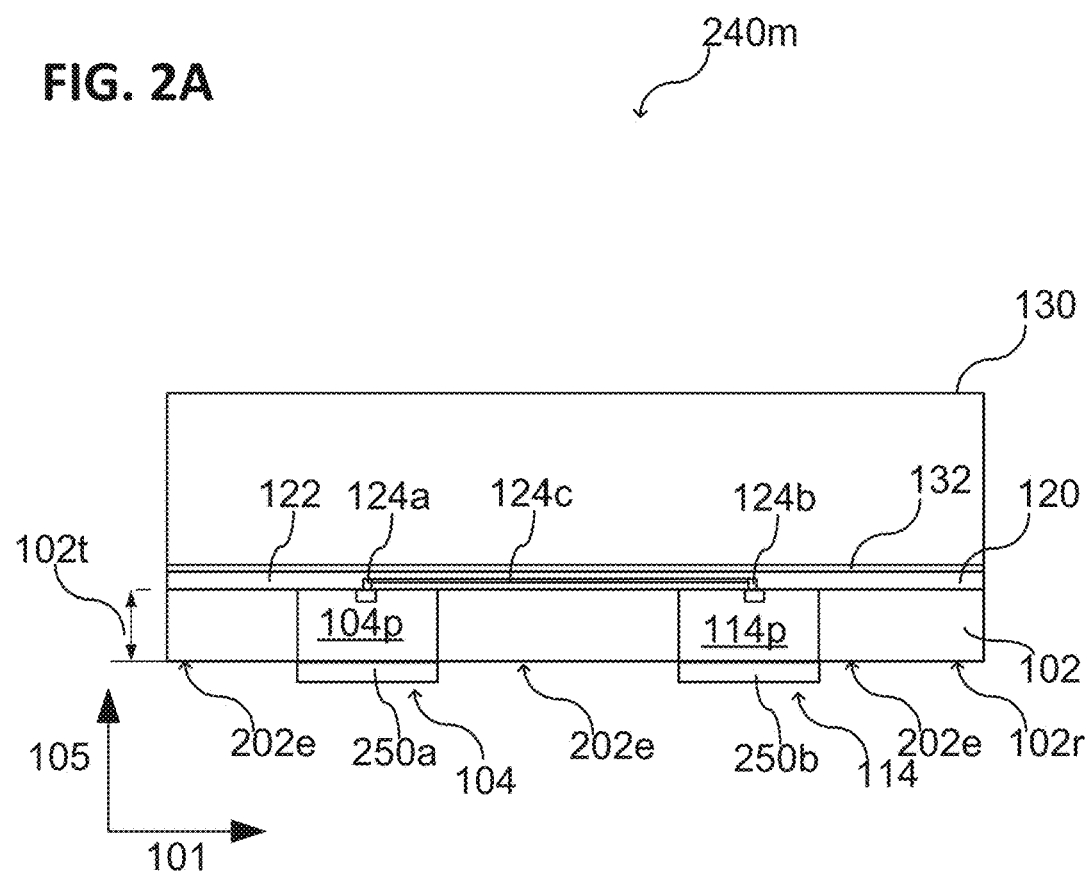
FIGS. 2A to 2D respectively show an electronic device at various stages during manufacturing in a schematic cross-sectional view, according to various embodiments.

According to various embodiments, FIGS. 2A to 2D illustrate an electronic device 100 at various stages during manufacturing, e.g. during method 200m is carried out as illustrated in FIG. 2E in a schematic flow diagram, according to various embodiments.

According to various embodiments, the method 200m for manufacturing an electronic device 100 may include: in 110m (cf. FIG. 1A), providing a semiconductor carrier 102, the semiconductor carrier 102 including a first vertically integrated electronic structure 104 and a second vertically integrated electronic structure 114 laterally spaced apart 101d from each other, and an electrical connection layer 120 disposed at a first side 102s of the semiconductor carrier 102, the electrical connection layer 120 electrically connecting the first vertically integrated electronic structure 104 and the second vertically integrated electronic structure 114 with each other; in 120m (cf. FIG. 1B), mounting the semiconductor carrier 102 on a support carrier 130, wherein the first side 102s of the semiconductor carrier 102 faces the support carrier 130; in 130m (cf. FIG. 1C), thinning the semiconductor carrier 102 from a second side 102r opposite the first side 102s; in 240m, forming a patterned seed layer 250a, 250b at the second side 102r of the semiconductor carrier 102, wherein exposed portions 202e of the semiconductor carrier 102 between the first vertically integrated electronic structure 104 and the second vertically integrated electronic structure 114 are free of the patterned seed layer (cf. FIG. 2A); in 250m, removing material of the semiconductor carrier 102 in the exposed portions 202e (cf. FIG. 2B), in 260m, forming a sidewall passivation layer 260 laterally surrounding the first vertically integrated electronic structure 104 and the second vertically integrated electronic structure 114 respectively, and, in 270m, forming a first contact pad 270a on the patterned seed layer 250a via an electroless plating process, the first contact pad 270a electrically contacting the first vertically integrated electronic structure 104, and forming a second contact pad 270b on the patterned seed layer 250b via an electroless plating process, the second contact pad 270b electrically contacting the second vertically integrated electronic structure 114. According to various embodiments, the sidewall passivation layer 260 may be optional or may be already part of the vertically integrated electronic structures 104, 114.

According to various embodiments, the seed layer 250a may include for example aluminum or any other suitable material for carrying out the electroless plating process. The patterned seed layer 250a and the first contact pad 270a may provide the first contact structure 150a as describe above with reference to FIG. 1E. The patterned seed layer 250b and the second contact pad 270b may provide the second contact structure 150b as describe above with reference to FIG. 1E. Alternatively, any other suitable contact pad or contact structure may be formed on the second side 102r of the semiconductor carrier 102 to electrically contact the vertically integrated electronic structures 104, 114. Alternatively, according to various embodiments, instead of an electroless plating process any other suitable process may be used to form the contact structures 150a, 150b described herein.

According to various embodiments, the sidewall passivation layer 260 may include for example an oxide (e.g. silicon oxide), a nitride (e.g. silicon nitride) and/or an oxynitride (e.g. silicon oxynitride). The sidewall passivation layer 260 may include any other dielectric material (e.g. having a relative permittivity of less than about 3.6, e.g. any other low-k dielectric material). Further, the dielectric material (e.g. having a relative permittivity of less than about 3.6, e.g. any low-k dielectric material) of the electrical connection layer 120 may include an oxide (e.g. silicon oxide), a nitride (e.g. silicon nitride), an oxynitride (e.g. silicon oxynitride), and/or the like.

According to various embodiments, the semiconductor region 104p, 114p of the respective vertically integrated electronic structure 104, 114 may be disposed between the respective contact structure 150a, 150b and the electrical connection layer 120.

According to various embodiments, the electronic device 100 may be configured as an electrostatic discharge (ESD) protection device, as described herein. In this case, the vertically integrated electronic structures 104, 114 are vertically integrated electrostatic discharge protection structures, e.g. including an ESD protection diode, an ESD protection transistor, and/or an ESD protection thyristor (also referred to as silicon controlled rectifier, SCR). Accordingly, in analogy to the electronic device 100 described above for example with reference to FIGS. 1E, 2B and 2D, the ESD protection device 100 may include: a first vertically integrated ESD protection structure 104 including a first semiconductor portion 104p, a first contact region 104c disposed on a first side of the first semiconductor portion 104p and a first terminal 150a exposed on a second side of the first semiconductor portion 104p opposite the first side, a second vertically integrated ESD protection structure 114 including a second semiconductor portion 114p, a second contact region 114c disposed on a first side of the second semiconductor portion 114p and a second terminal 150b exposed on a second side of the second semiconductor portion 114*p* opposite the first side, an electrical connection layer 120, wherein the first vertically integrated ESD protection structure 104 and the second vertically integrated ESD protection structure 114 are disposed on the electrical connection layer 120 laterally separated from each other, wherein the electrical connection layer 120 includes at least one first via 124*a* embedded in dielectric material contacting the first contact region 104*c* and at least one second via 124*b* embedded in dielectric material contacting the second contact region 114*c*, wherein the electrical connection layer 120 further includes at least one metal line electrically connecting the least one first via 124*a* and the least one second via 124*b* with each other; wherein the electrical connection layer 120 is mounted on a support carrier 130 via at least one adhesive layer 132.

Further, according to various embodiments, a region 140 between the first vertically integrated ESD protection structure 104 and the second vertically integrated ESD protection structure 114 may be free of semiconductor material. The region 140 between the first vertically integrated ESD protection structure 104 and the second vertically integrated ESD protection structure 114 may be free of any solid material. According to various embodiments, the electrical connection layer may be partially exposed in the region 140 between the first vertically integrated ESD protection structure 104 and the second vertically integrated ESD protection structure 114. Therefore, the electrical parasitic impedance (caused by the parasitic capacity) of the electrostatic discharge (ESD) protection device 100 may be low.

According to various embodiments, the first semiconductor portion 104*p* may be configured (e.g. respectively doped regions may be formed in the first semiconductor portion 104*p*) as at least one of the following electronic structures: a vertically integrated diode, a vertically integrated transistor, and a vertically integrated thyristor.

According to various embodiments, the second semiconductor portion 114*p* may be configured (e.g. respectively doped regions may be formed in the first semiconductor portion 104*p*) as at least one of the following electronic structures: a vertically integrated diode, a vertically integrated transistor, and a vertically integrated thyristor. The first semiconductor portion 104*p* may have a thickness of less than 15 μm. The second semiconductor portion 114*p* may have a thickness of less than 15 μm. Therefore, the vertical electrical resistance of the semiconductor portions may be low.

Figure 2B:
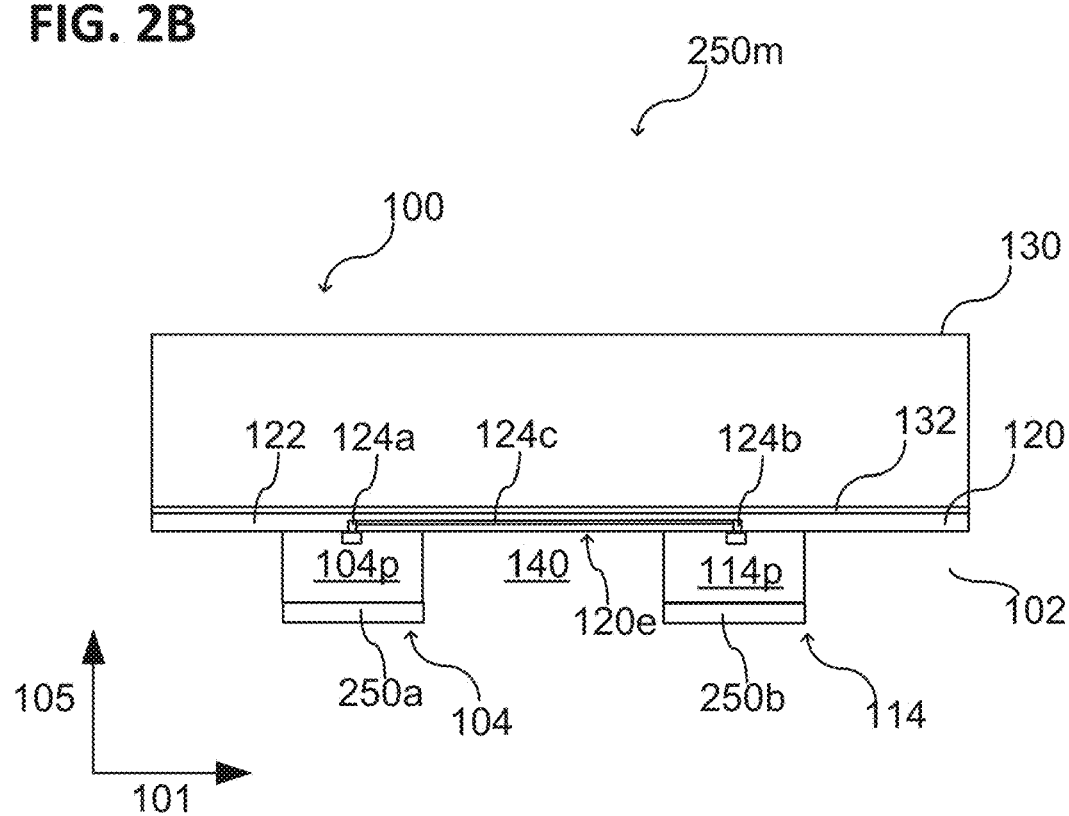
Figure 2C:
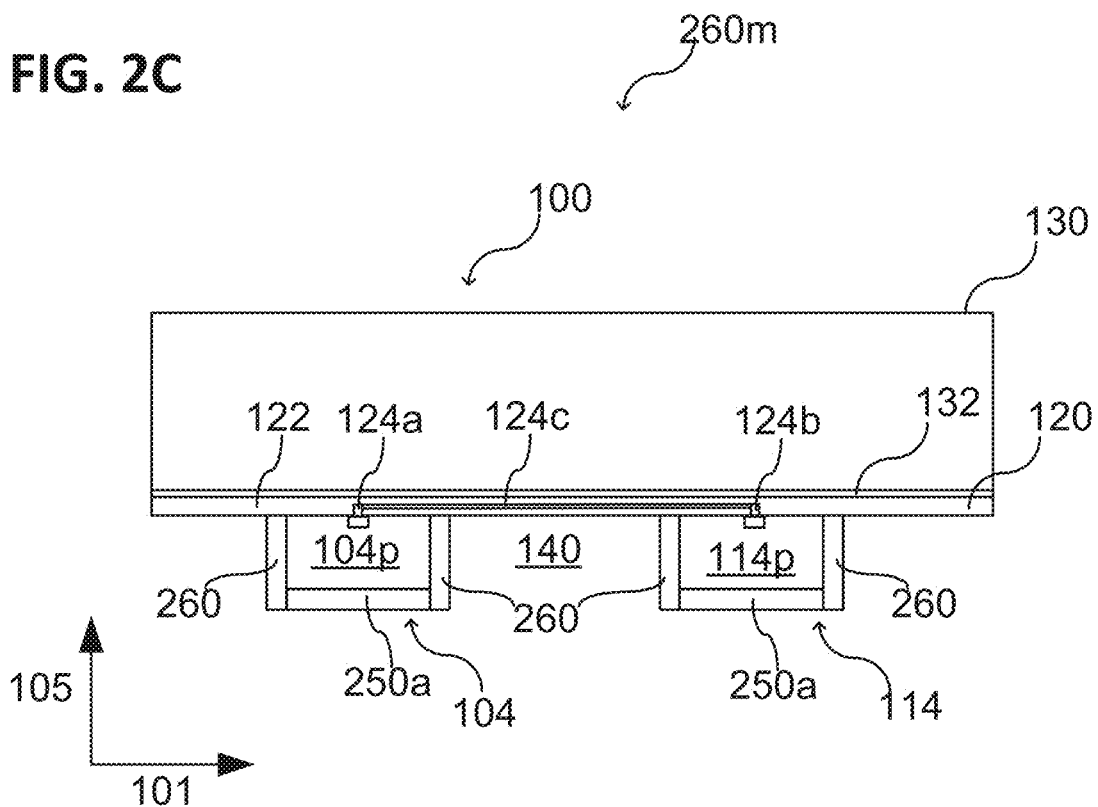
Figure 2D:
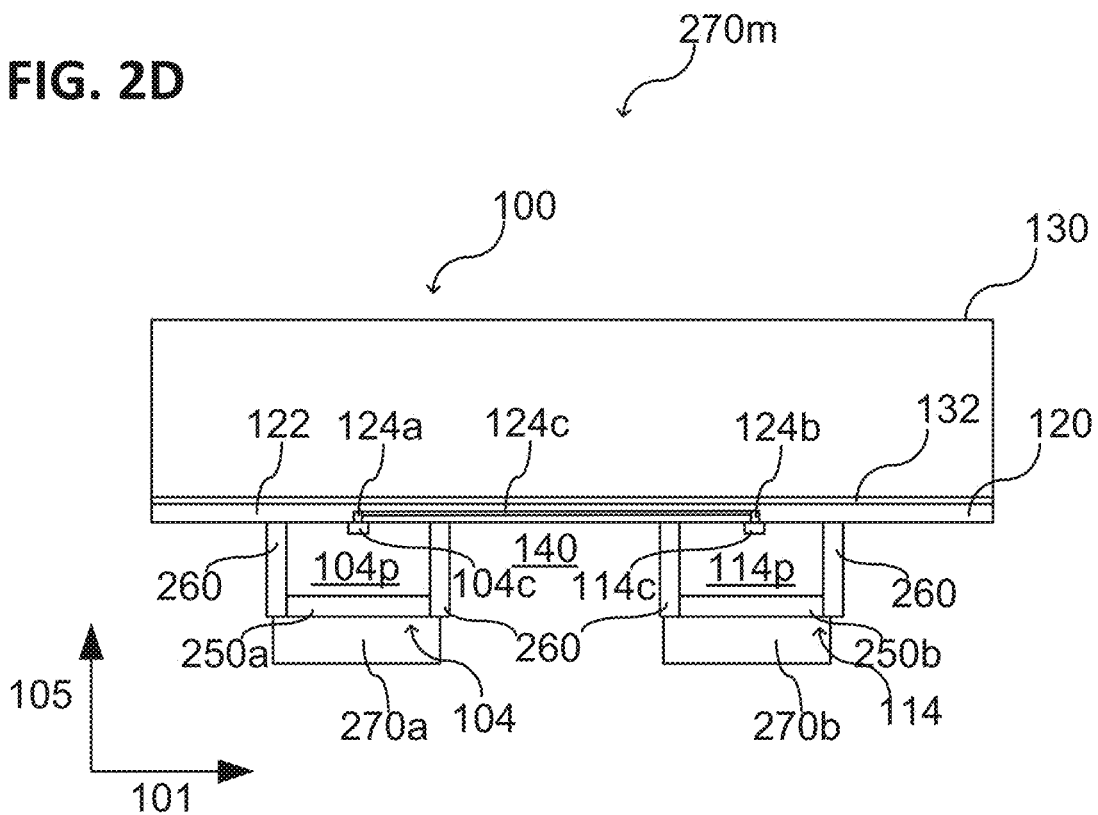

According to various embodiments, an isolation structure 260 (also referred to as isolation layer or passivation layer) may laterally surround the first semiconductor portion 104*p* and the second semiconductor portion 114*p* respectively (cf. for example FIG. 2D).

According to various embodiments, the first terminal (e.g. a first contact pad) may have substantially the same lateral extension as the first semiconductor portion 104*p*. The second terminal (e.g. a second contact pad) may have substantially the same lateral extension as the second semiconductor portion 114*p*, as already described. The electrical connection layer may only be electrically accessible through the ESD protection structures 104, 114 so that only the first terminal 150*a* and the second terminal 150*b* may be used to operate the electrostatic discharge (ESD) protection device 100, i.e. the two electrostatic discharge protection structures 104, 114 of the electrostatic discharge protection device 100. The respective terminal may be a single metal layer 150*a*, 150*b* or may include at least one metal layer 150*a*, 150*b*, as for example illustrated in FIG. 1E. Further, the respective terminal may include a seed layer portion 250*a*, 250*b* and an electroless plated portion 270*a*, 270*b*, as for example illustrated in FIG. 2D. According to various embodiments, the terminals may allow to include the ESD protection device 100 into an electronic device as desired to protect at least one electronic circuit from over-voltage/electro-static-discharge damage. According to various embodiments, the one of the terminals may be coupled to an I/O pad or a supply bus and the other one of the terminals may be coupled to a ground bus (cf. FIGS. 3A and 3B).

According to various embodiments, the semiconductor carrier 102 described herein may include or may consist of silicon, e.g. may be a silicon wafer 102. Accordingly, the respective semiconductor portion 104*p*, 114*p* may include silicon or may be a silicon portion.

According to various embodiments, the ESD protection device 100 may be included in an electronic circuit device to protect an electronic circuit from an electrostatic discharge or any other overvoltage.

Figure 3A:
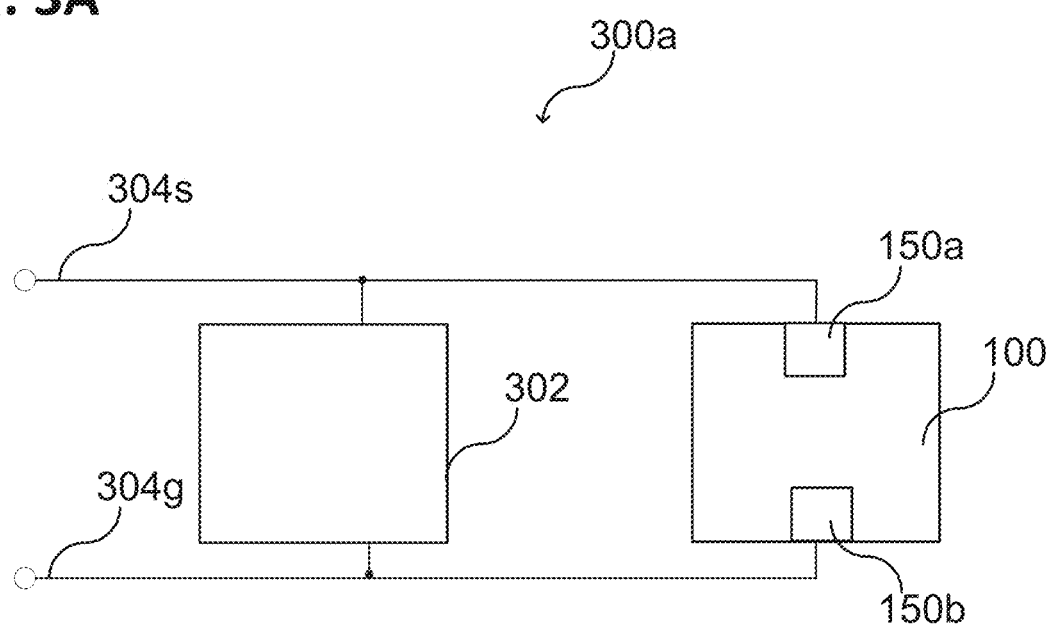
FIGS. 3A and 3B schematically show an electronic circuit device including an electrostatic discharge protection device, according to various embodiments.

FIG. 3A illustrates an electronic circuit device 300*a* including an ESD protection device 100, as described herein. The electronic circuit device 300*a* may include an electronic circuit 302. The electronic circuit may include a first bus 304*s* (e.g. a supply bus) and a second bus 304*g* (e.g. a ground bus). Further, the electronic circuit 302 may be configured to be operated by a first electric potential at the first bus 304*s* and by a second electric potential lower than the first electric potential at the second bus 304*g*. The ESD protection device 100 may be coupled between the first bus 304*s* and the second bus 304*g* to protect the electronic circuit 302 from an electrostatic discharge event. As described above (cf. FIG. 1E or FIG. 2D), the first terminal 150*a* of the ESD protection device 100 may be coupled to the first bus 304*s* and the second terminal 150*b* of the ESD protection device 100 may be coupled to the second bus 304*g*.

Figure 3B:
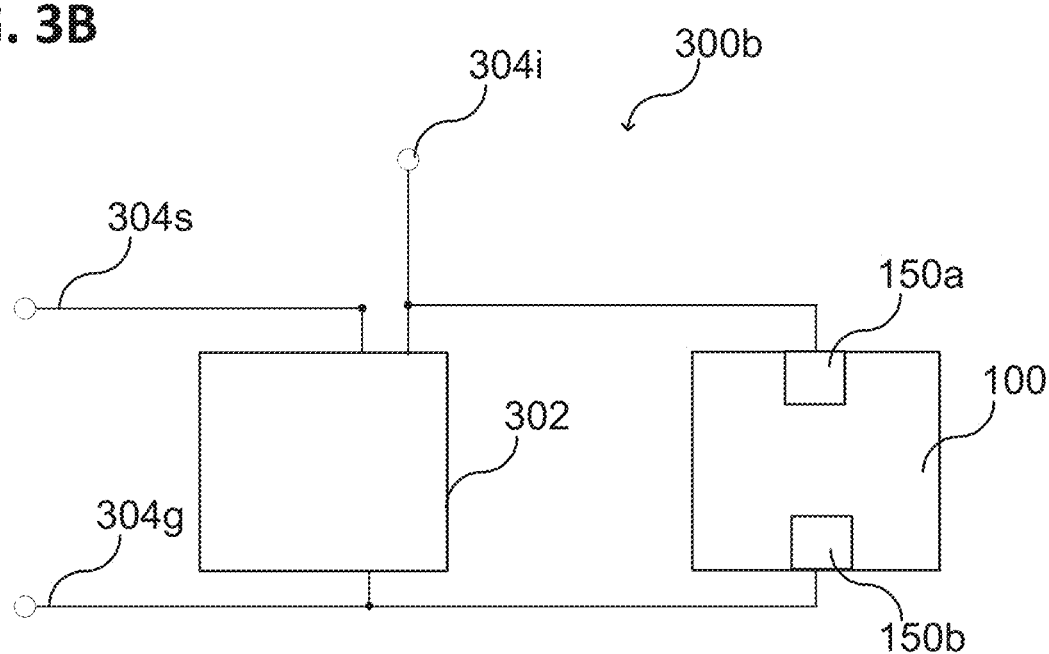

FIG. 3B illustrates an electronic circuit device 300*b* including an ESD protection device 100, as described herein. The electronic circuit device 300*b* may include an electronic circuit 302. The electronic circuit including a first bus 304*s* (e.g. a supply bus), a second bus 304*g* (e.g. a ground bus), and an I/O-pad 304*i*. The electronic circuit 302 may be configured to be operated by a first electric potential at the first bus 304*s* and by a second electric potential lower than the first electric potential at the second bus 304*g*. According to various embodiments, the ESD protection device 100 may be coupled at least between the I/O-pad 304*i* and the second bus 304*g* to protect the electronic circuit 302 from an electrostatic discharge event at least between the I/O-pad 304*i* and the ground bus 304*g*. As described above (cf. FIG. 1E or FIG. 2D), the first terminal 150*a* may be coupled to the FO-pad 304*i* and the second terminal 150*b* may be coupled to the second bus 304*g*.

Various modifications of the electronic circuit devices 300*a*, 300*b* may be made to include one or more of the ESD protection devices 100 described herein, e.g. bi-directional, to protect an electronic circuit 302 from an ESD event. The ESD protection device 100 may for example connect two contacts of the electronic circuit 302 with each other. The ESD protection device 100 may be coupled in parallel to the electronic circuit 302.

Figure 4A:
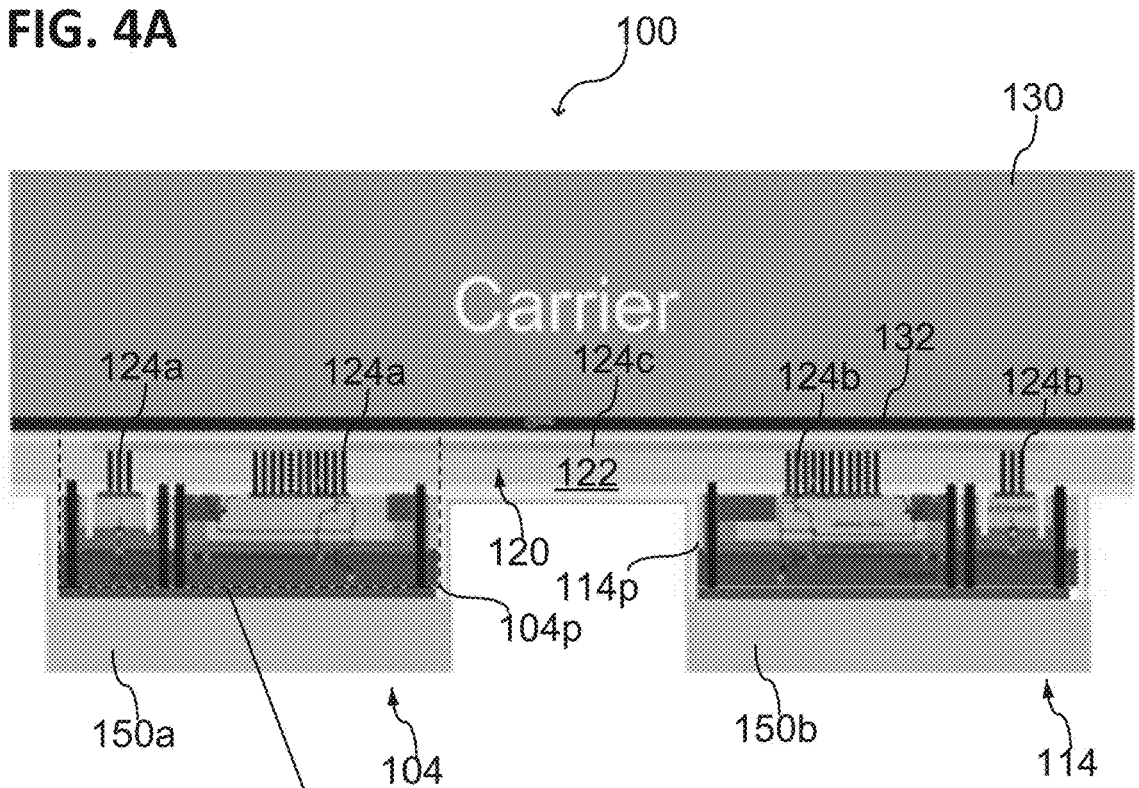
FIGS. 4A and 4B schematically show an electrostatic discharge protection device in a schematic cross-sectional view, according to various embodiments.
Figure 4B:
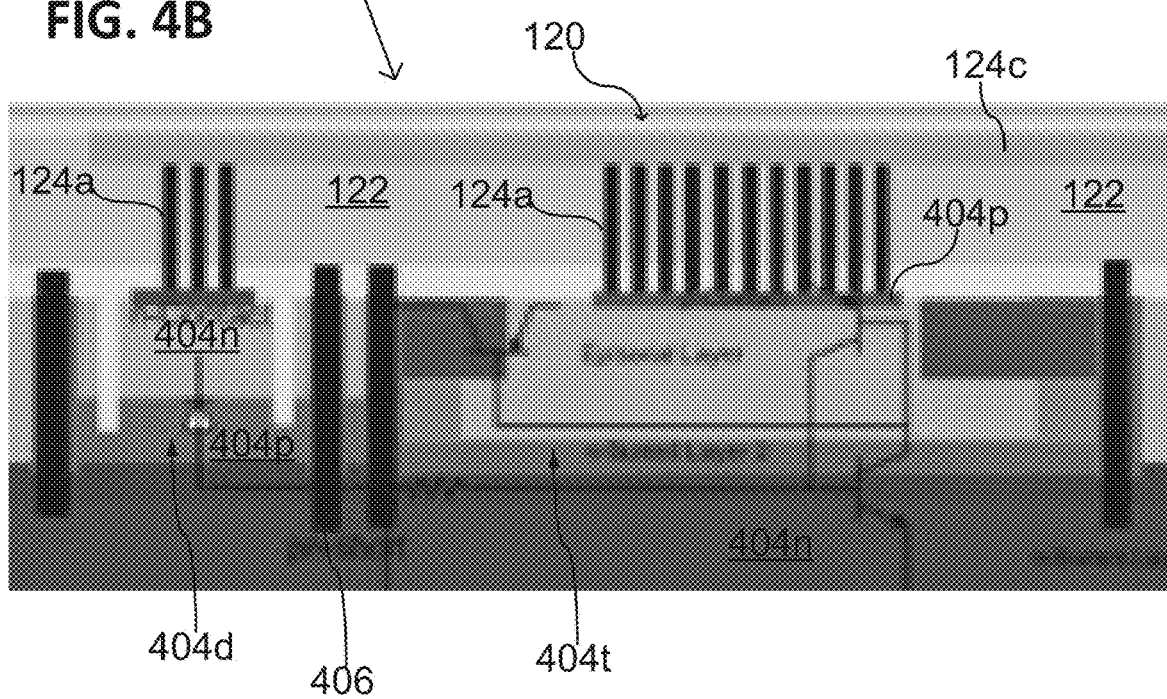

FIG. 4A illustrates a schematic cross-sectional view of an ESD protection device 100 (e.g. an electronic device 100 configured as an ESD protection device 100), according to various embodiments. FIG. 4B shows a detailed view of the ESD protection structures 104, 114. The Example is described with reference to a diode and a thyristor; however, any other suitable ESD protection element can be used in a similar way.

According to various embodiments, the first ESD protection structure 104 may include at least two ESD protection structure elements in an anti-parallel arrangement. For example, the first ESD protection structure 104 may include a first ESD protection diode (e.g. a PIN diode) 404d and a first ESD thyristor 404t coupled in parallel to each other. The first ESD protection diode 404d may be for example contacted by the first terminal 150a and by the electrical connection layer 120. The first ESD thyristor may be also contacted by the first terminal 150a and by the electrical connection layer 120 (e.g. by the at least one first via embedded in dielectric material 122). To bi-directionally divert current through the first ESD protection structure 104 the at least two ESD protection structure elements may be provided in an anti-parallel arrangement. For example, the first ESD protection diode 404d may include a pn-junction arranged in the first semiconductor portion 104p, wherein the p-region 404p of the pn-junction is contacted by the first terminal 150a and wherein the n-region 404n of the pn-junction is contacted by the electrical connection layer 120, e.g. by the at least one first via 124a. Further, the first ESD protection thyristor 404t may include a three pn-junctions (also referred to as pnpn-junction) arranged in the first semiconductor portion 104p, wherein an n-region 404n of the pnpn-junction is contacted by the first terminal 150 and wherein a p-region 404p of the pnpn-junction is contacted by the electrical connection layer 120, e.g. by the at least one first via 124a. According to various embodiments, the first ESD protection structure 104 may include a plurality of doped regions to provide respective ESD protection structure elements as desired. The first ESD protection structure 104 may include pn-shorts 406 arranged in the first semiconductor portion 104p providing an electrical short between adjacent pn-regions respectively.

Illustratively, the one or more pn-junctions of the respective ESD protection structure element define a polarity. In general, two anti-parallel or inverse-parallel protection structure elements are connected in parallel but with their polarities reversed.

In a similar way, the second ESD protection structure 114 may include at least two ESD protection structure elements in an anti-parallel arrangement. For example, the second ESD protection structure 114 may include a second ESD protection diode (e.g. a PIN diode) and a second ESD thyristor coupled in parallel to each other. The second ESD protection diode may be for example contacted by the second terminal 150b and by the electrical connection layer 120. The second ESD thyristor may be also contacted by the second terminal 150b and by the electrical connection layer 120. To bi-directionally divert current through the second ESD protection structure 104 the at least two ESD protection structure elements may be provided in an anti-parallel arrangement. For example, the second ESD protection diode may include a pn-junction arranged in the second semiconductor portion 114p, wherein the p-region of the pn-junction is contacted by the second terminal 150 and wherein the n-region of the pn-junction is contacted by the electrical connection layer 120, e.g. by the at least one second via 124b. Further, the second ESD protection thyristor may include a three pn-junctions (also referred to as pnpn-junction) arranged in the second semiconductor portion 114p, wherein an n-region of the pnpn-junction is contacted by the second terminal 150b and wherein a p-region of the pnpn-junction is contacted by the electrical connection layer 120, e.g. by the at least one second via 124b. According to various embodiments, the two vertically integrated ESD protection structures 104, 114 of the ESD protection device 100 may have the same structure.

According to various embodiments, the first ESD protection structure 104 and the second ESD protection structure 114 may be in an anti-serial arrangement. This allows for example to utilize the (for example superior) ESD characteristics of the ESD thyristor in the anti-parallel arrangement described above to bi-directionally divert current thought the ESD protection device 100, i.e. to divert ESD stress from the first terminal 150a to the second terminal 150b and, with the same ESD characteristics, also from the second terminal 150b to the first terminal 150a. As an example, the two ESD thyristors 404t of the ESD protection structures 104, 114 are in an anti-serial arrangement, e.g. serially coupled between the terminals 150a, 150b via the electrical connection layer 120. Further, also the two ESD diodes 404d of the ESD protection structures 104, 114 are in an anti-serial arrangement, e.g. serially coupled between the terminals 150a, 150b via the electrical connection layer.

Figure 5A:
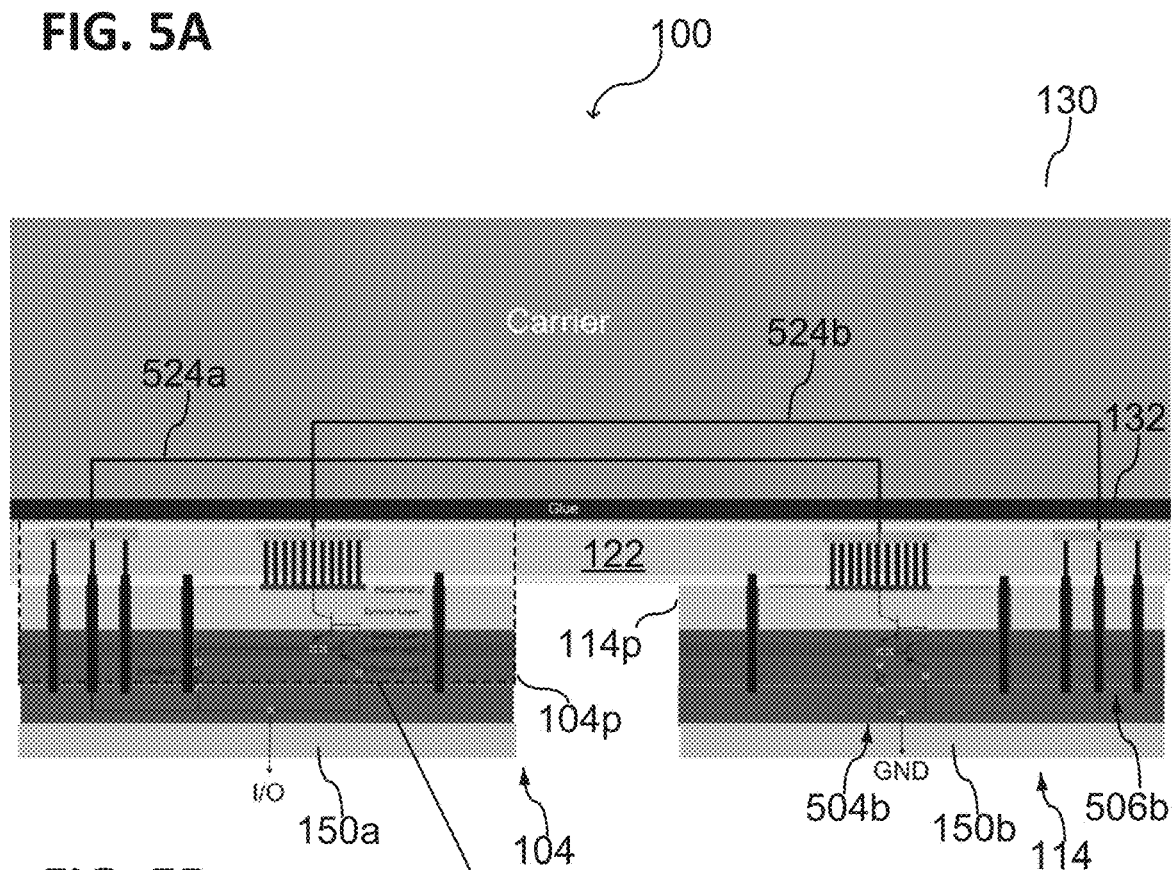
FIGS. 5A and 5B schematically show an electrostatic discharge protection device in a schematic cross-sectional view, according to various embodiments.
Figure 5B:
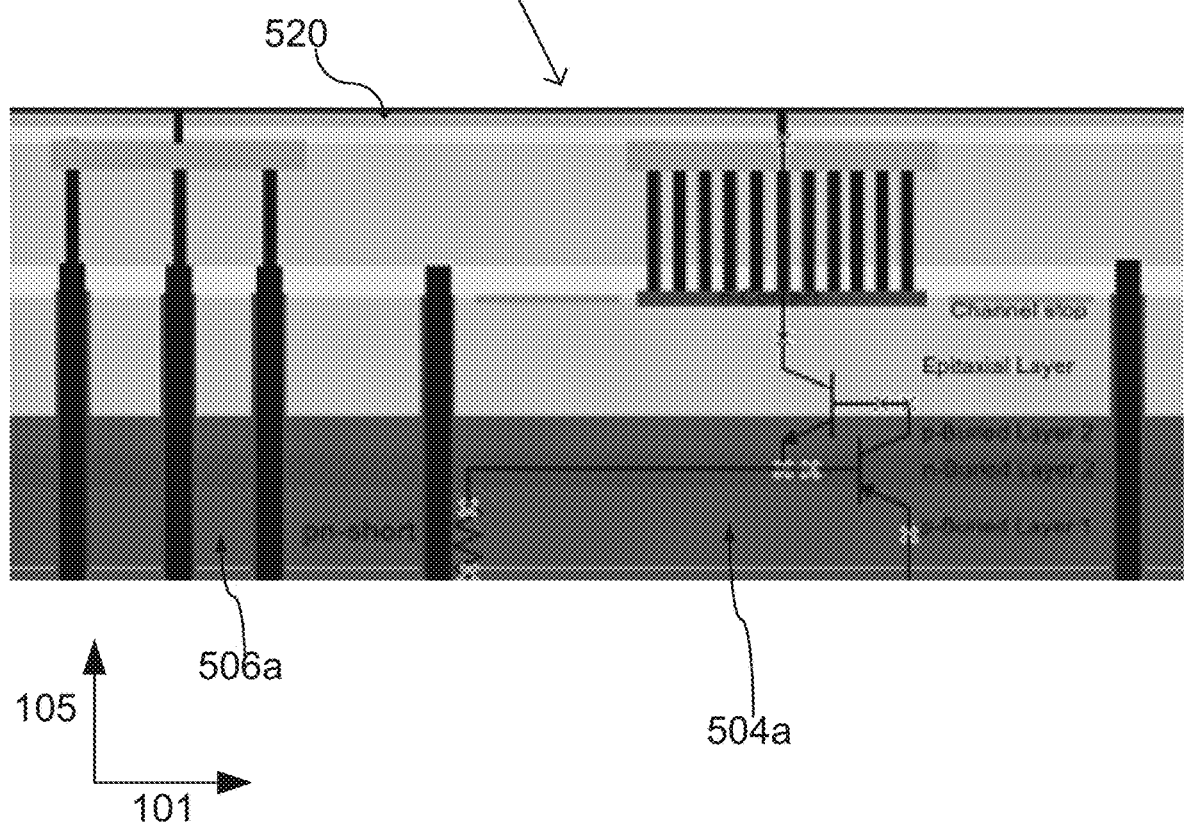

FIG. 5A illustrates a schematic cross-sectional view of an ESD protection device 100 (e.g. an electronic device 100 configured as an ESD protection device 100), according to various embodiments. FIG. 5B shows a detailed view of the ESD protection structures 104, 114. The Example is described with reference to an electrical short and a thyristor; however, any other suitable configuration can be used in a similar way. Illustratively, the ESD diode 404d described in FIGS. 4A and 4B may be replaced by an electrical short 504 that electrically conductively connects the respective terminal with the electrical connection layer 120. To avoid an electrical shortcut between the two terminals 150a, 150b, the configuration of the electrical connection layer 520 is adapted accordingly to provide a bi-directional ESD protection device 100.

According to various embodiments, the first ESD protection structure 104 may include at least one first electrical short 506a and a first thyristor structure 504a. Further, the second ESD protection structure 114 may include at least one second electrical short 506b and a second thyristor structure 504b. The at least one first electrical short 506a and the second thyristor structure 504b are coupled in series with each other via the electrical connection layer 520. Further, the at least one second electrical short 506b and the first thyristor structure 504a are coupled in series with each other via the electrical connection layer 520. The series connection of the at least one first electrical short 506a and the second thyristor structure 504b and the series connection of the at least one second electrical short 506b and the first thyristor structure 504a are arranged in parallel between the terminals 150a, 150b.

Of course, the at least one first electrical short 506a and the first thyristor structure 504a are not electrically conductively connected via the electrical connection layer 520. Further, the at least one second electrical short 506b and the second thyristor structure 504b are not electrically conductively connected via the electrical connection layer 520. Illustratively, the electrical connection layer 520 may include a first connection structure 524a, e.g. including one or more vias and/or one or more metal lines, electrically conductively connecting the at least one first electrical short 506a and the second thyristor structure 504b with each other. Further, the electrical connection layer 520 may include a second connection structure 524b, e.g. including one or more vias and/or one or more metal lines, electrically conductively connecting the at least one second electrical short 506b and the first thyristor structure 504a with each other.

According to various embodiments, the at least two connection structures 524a, 524b may be routed within the electrical connection layer 520, i.e. FIG. 5A illustrates the connection structures 524a, 524b not in their actual positional arrangement but illustrates the electrical connection as a circuit diagram.

According to various embodiments, FIGS. 6A to 6F illustrate respective cross-sectional views of an electronic device 100 at various stages during manufacture, e.g. during a method 100m or 200m is carried out, as described above, according to various embodiments. The Examples are illustrated with reference to a diode and a thyristor as described for example with reference to FIGS. 4A and 4B; however, any other suitable configuration can be used in a similar way.

Figure 6A:
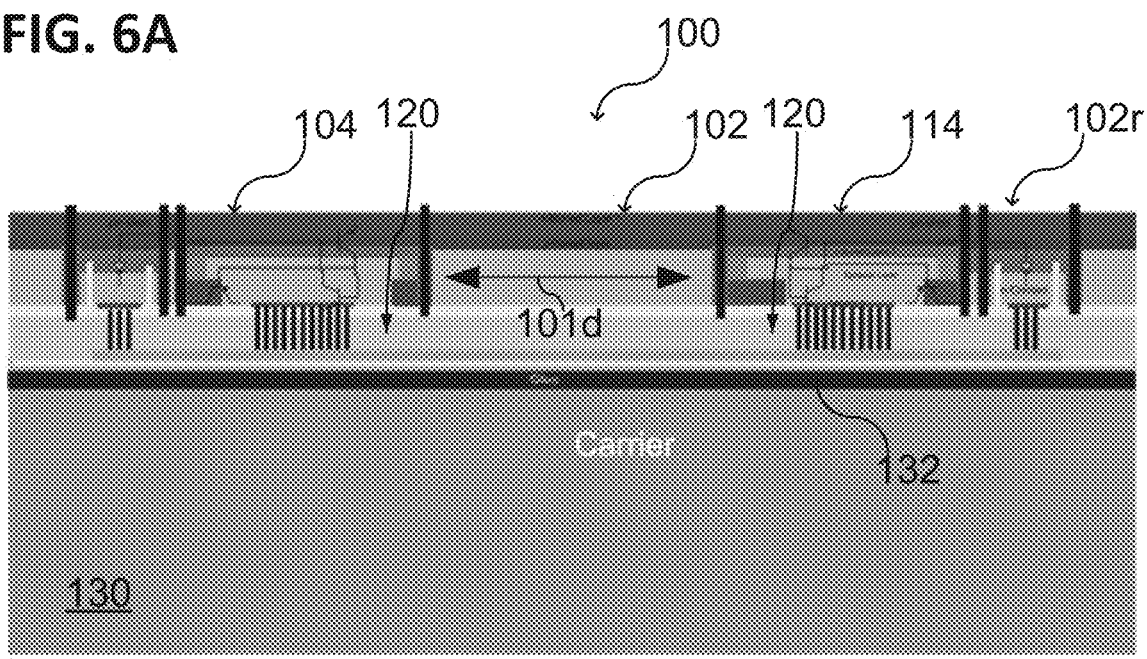
FIGS. 6A to 6F respectively show an electrostatic discharge protection device at various stages during manufacturing in a schematic cross-sectional view, according to various embodiments.

As illustrated in FIG. 6A, a semiconductor carrier 102 may be mounted on a support carrier 130 and thinned to a desired thickness, as described above. The semiconductor carrier 102 may include a first vertically integrated electronic structure 104 (e.g. configured as a first vertically integrated ESD protection structure 104) and a second vertically integrated electronic structure 114 (e.g. configured as a second vertically integrated ESD protection structure 114) laterally spaced apart 101d from each other, and an electrical connection layer 120 disposed at a first side 102s of the semiconductor carrier 102, the electrical connection layer 120 electrically connecting the first vertically integrated electronic structure 104 and the second vertically integrated electronic structure 114 with each other.

Figure 6B:
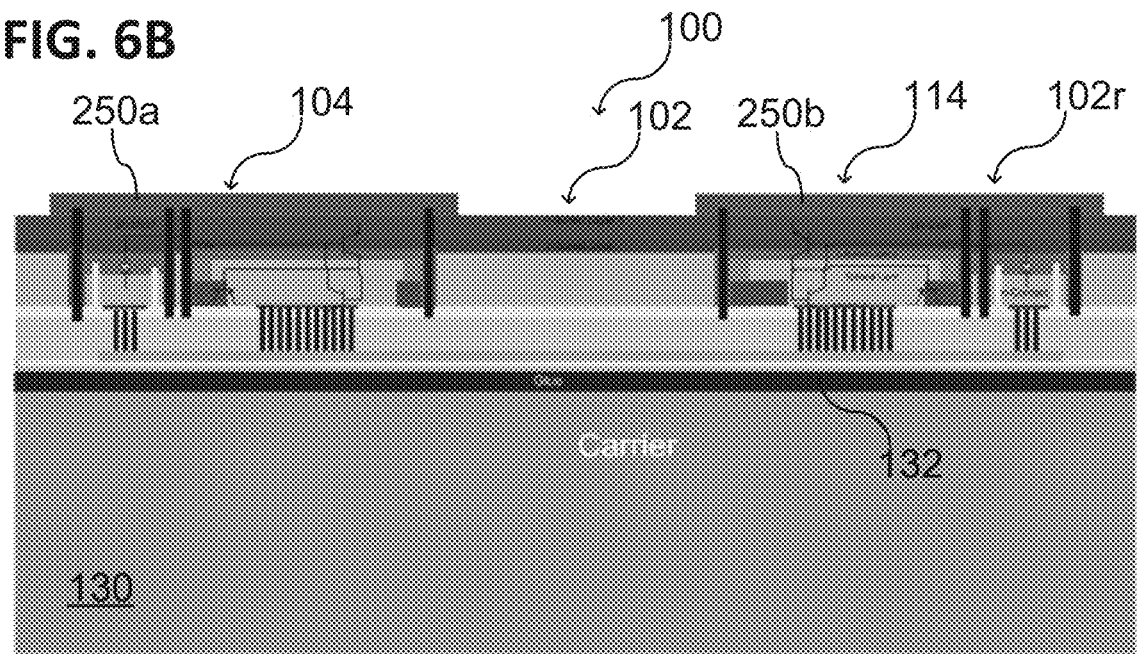

As illustrated in FIG. 6B, a patterned seed layer 250a, 250b may be formed at the second side 102r of the semiconductor carrier 102. Exposed portions 202e of the semiconductor carrier 102 may be provided between the first vertically integrated electronic structure 104 and the second vertically integrated electronic structure 114. The exposed portions 202e of the semiconductor carrier 102 are free of the patterned seed layer. The patterned seed layer may be used as mask layer for removing semiconductor material of the semiconductor carrier 102 in the exposed portions 202e of the semiconductor carrier 102. The seed layer may be formed by a deposition process, e.g. physical or chemical vapor deposition.

Figure 6C:
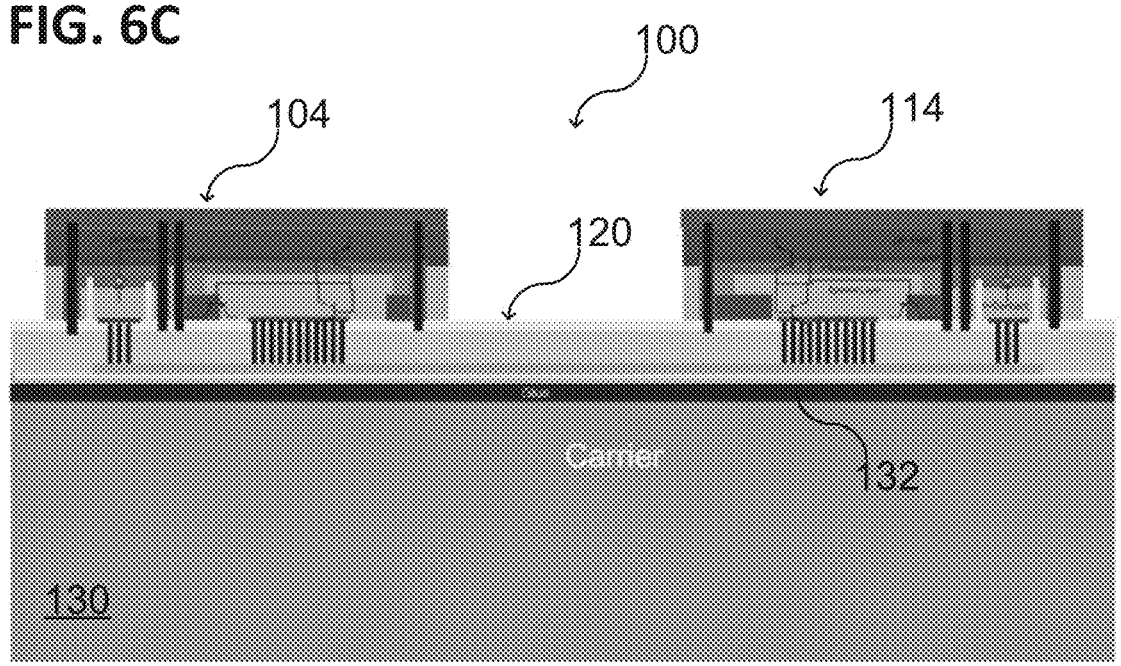

As illustrated in FIG. 6C, semiconductor material of the semiconductor carrier 102 may be removed (e.g. via an etch process, e.g. via reactive ion etching) in the exposed portions 202e (cf. FIG. 2B).

Figure 6D:
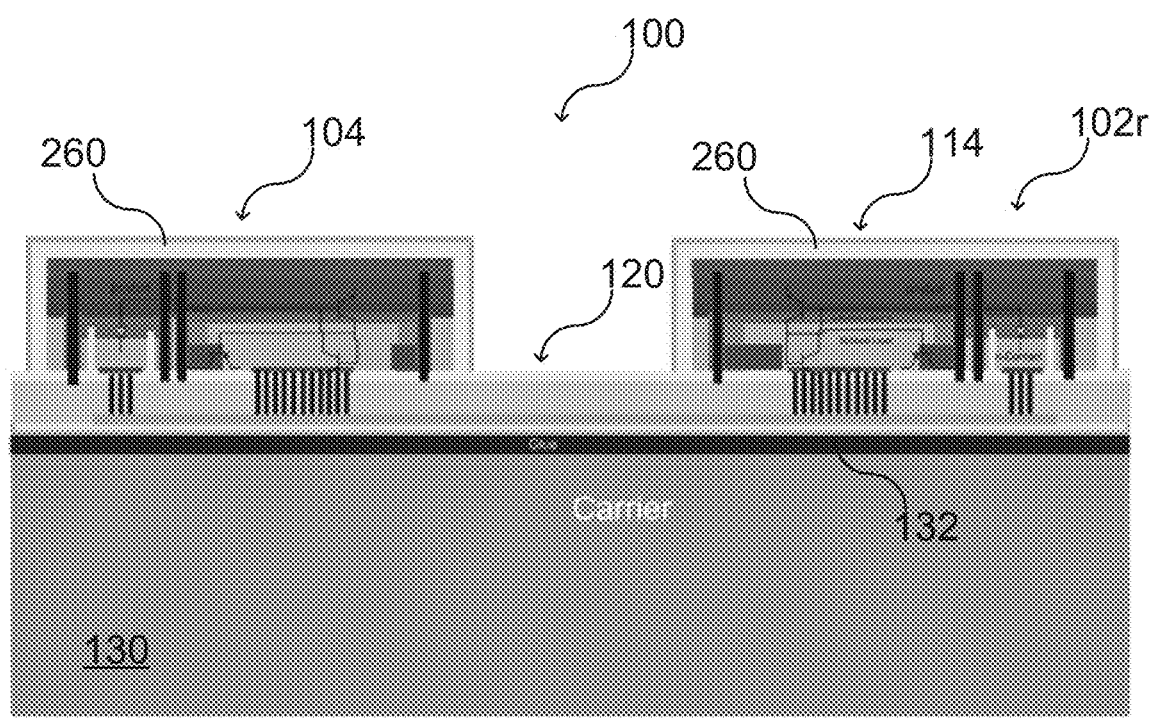

As illustrated in FIG. 6D, a sidewall passivation layer 260 may be formed. The sidewall passivation layer 260 may laterally surround the first vertically integrated electronic structure 104 and the second vertically integrated electronic structure 114 respectively. The sidewall passivation layer 260 may be conformally deposited from the second side 102r of the carrier (e.g. using atomic layer deposition or plasma enhanced chemical vapor deposition). In this case, the sidewall passivation layer 260 may conformally cover the vertically integrated electronic structures 104, 114 and at least a part of the electrical connection layer 120, e.g. the exposed regions of the electrical connection layer 120. The sidewall passivation layer 260 may be a single layer or a layer stack including a plurality of layers, e.g. oxide and/or nitride layers.

Figure 6E:
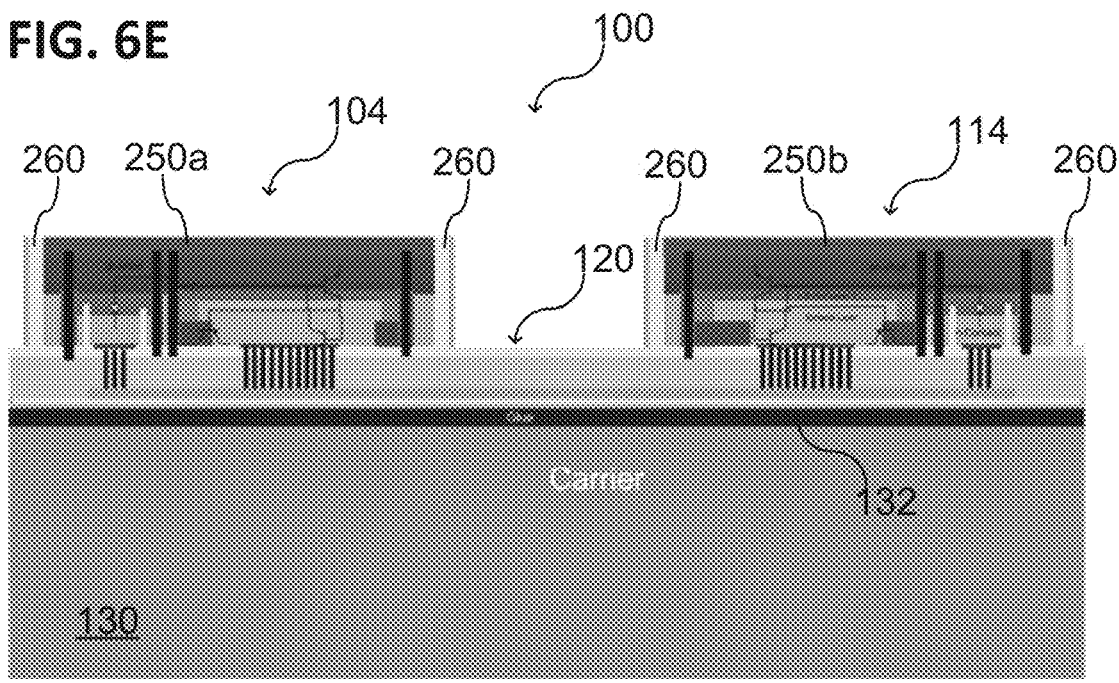

As illustrated in FIG. 6E, the sidewall passivation layer 260 may be partially removed to expose the patterned seed layer 250a, 250b portions of each of the vertically integrated electronic structures 104, 114. The sidewall passivation layer 260 may only laterally surround the semiconductor portions of the vertically integrated electronic structures 104, 114.

Figure 6F:
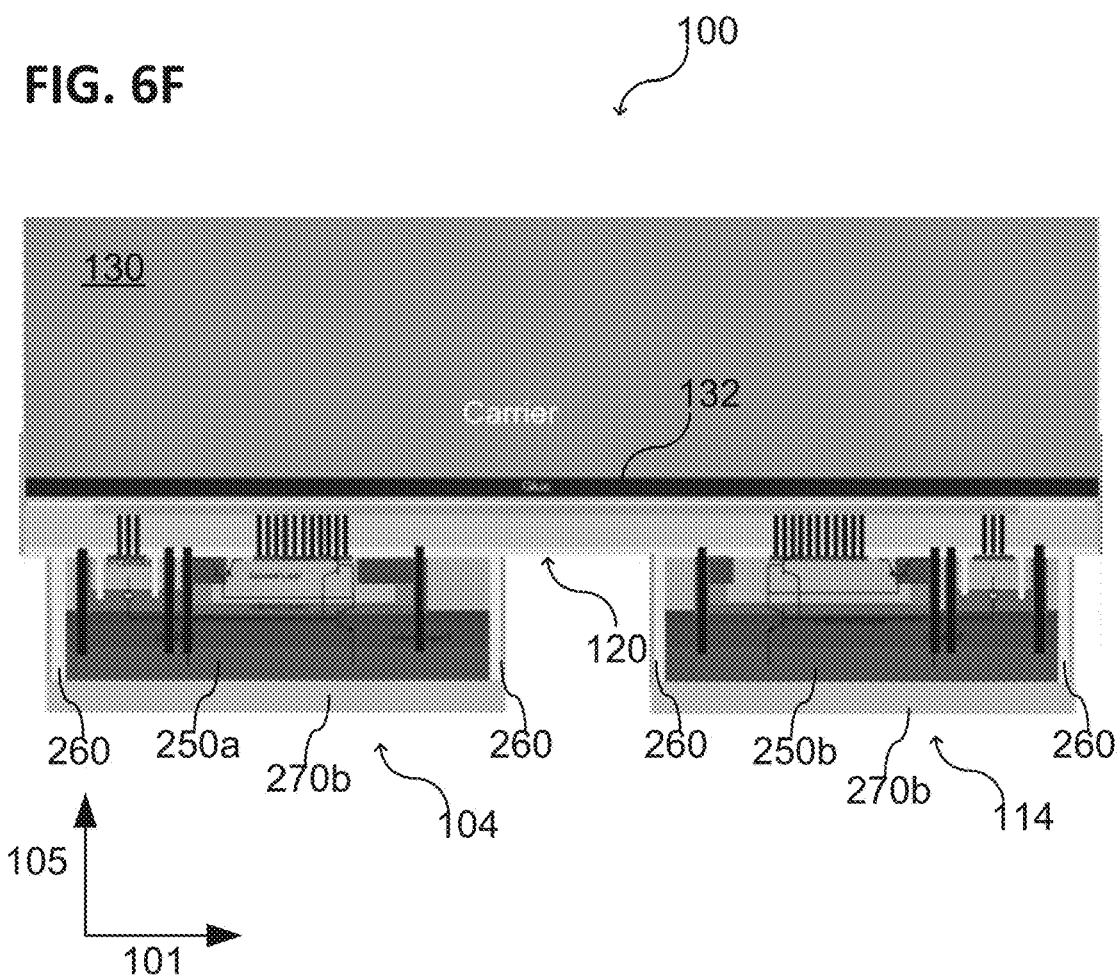

As illustrated in FIG. 6F, contact pads 270a, 270b may be formed on the patterned seed layer 250a, 250b for each of the vertically integrated electronic structures 104, 114, e.g. via an electroless plating process. The contact pads 270a, 270b may provide the terminals for the electronic device 100.

Figure 6G:
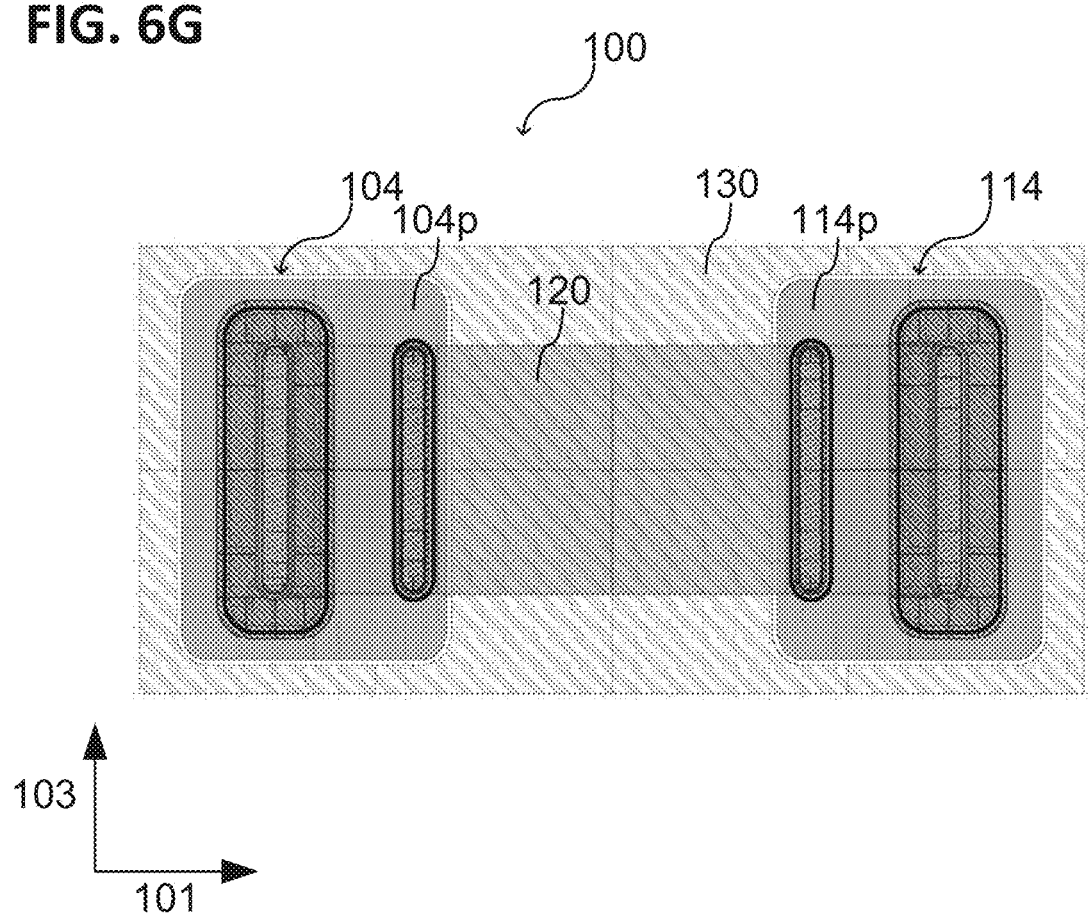
FIG. 6G shows an electrostatic discharge protection device in a top view, according to various embodiments.

FIG. 6G illustrates a top view (i.e. perpendicular to the lateral directions 101, 103) of the electronic device 100 after processing, e.g. after method 100m, 200m has been carried out. According to various embodiments, the semiconductor portions 104p, 114p are laterally separated from each other so that the metal lines of the electrical connection layer 120 have a reduced vertical overlap area with semiconductor material. This may reduce the parasitic capacitance of the electronic device 100.

Illustratively, a process flow for processing the semiconductor carrier 102 may include: bonding the carrier 102 on a support carrier (e.g. on a silicon support carrier), polishing the semiconductor carrier 102 to reduce/remove substrate thickness (e.g. down to less than about 15 μm, e.g. down to about 10 μm), deposition of a seed layer (e.g. including or consisting of aluminum) for I/O-pin plating, remove not needed semiconductor material (e.g. silicon), e.g. via etching, passivation deposition (e.g. further kerf-, glue- and carrier-etch), passivation etch (e.g. reactive ion etching) for sidewall passivation, electroless plating for I/O-pin definition.

Removing the not needed silicon may decouple the I/O to ground. According to various embodiments, all semiconductor material between the active devices may be removed to decouple the devices active, i.e. to reduce parasitic capacitances. According to various embodiments, semiconductor material may only be left below I/O-Pad structures (also referred to as terminals 150a, 150b). According to various embodiments, reducing the semiconductor carrier 102 thickness may reduce the parasitic resistance. Further, low production cost may be achieved. The process flow is applicable for every vertical device. The permanent support carrier 130 may allow extremely thin and small devices. The final thin and small device must not be removed from the support carrier. This may allow extreme active device dimensions.

Figure 7A:
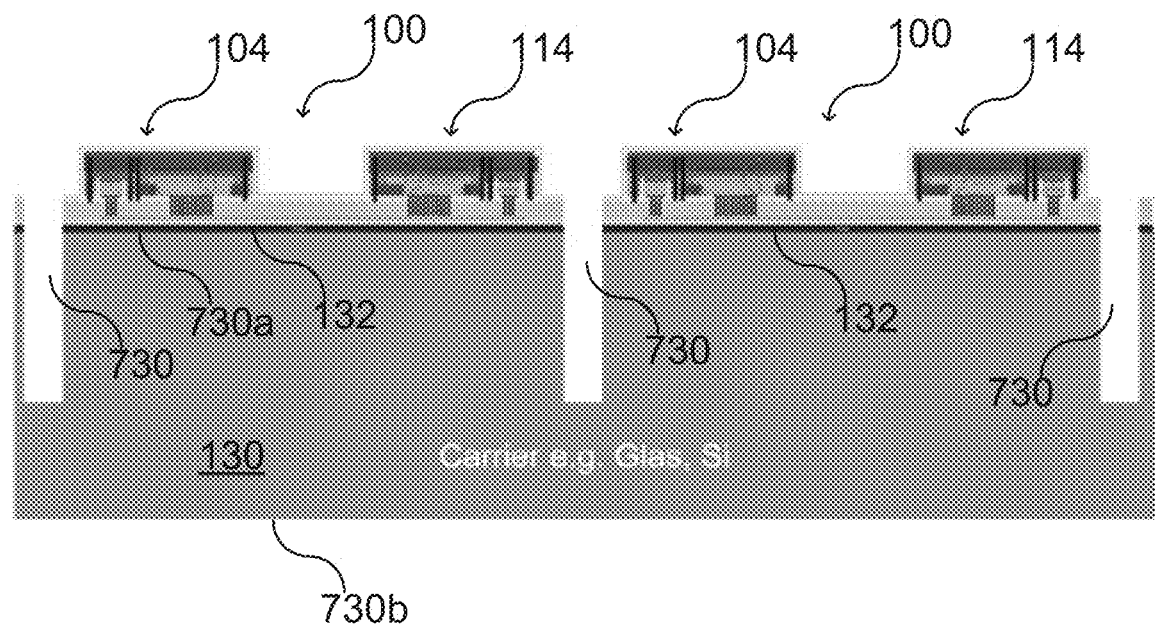
FIGS. 7A and 7B respectively show an electrostatic discharge protection device at various stages during manufacturing in a schematic cross-sectional view, according to various embodiments.

According to various embodiments, a plurality of electronic devices 100 may be processed on a single semiconductor carrier 102, as illustrated for example in FIG. 7A in a schematic cross-sectional view.

Figure 7B:
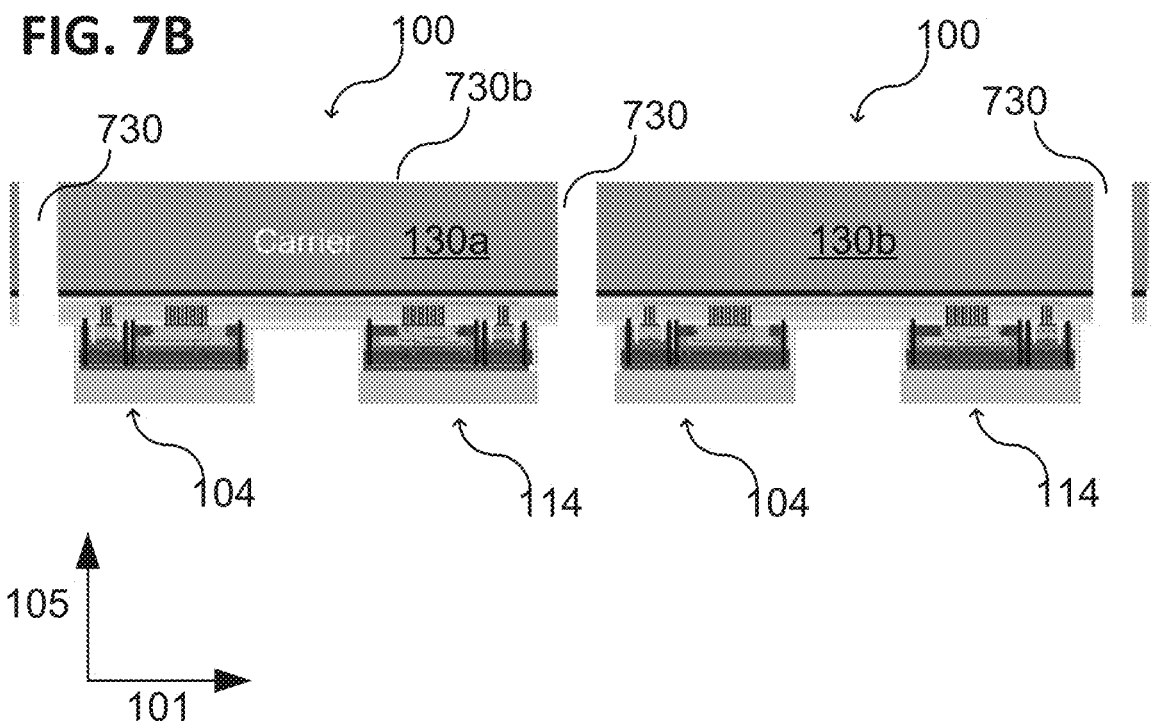

Therefore, the electrical connection layer 120, the adhesive layer 132, and the support carrier 130 may be partially removed in regions between respectively adjacent electronic devices 100 to singulate the electronic devices 100 from each other. According to various embodiments, if the electronic devices 100 are readily processed, e.g. after method 100m, 200m has been carried out, the support carrier is diced by grinding (or by any other suitable technique, e.g. sawing, laser dicing, etc.), as illustrated for example in FIG. 7B in a schematic cross-sectional view. Therefore, at least one trench structure 730 is formed in the support carrier 130. The at least one trench structure 730 may laterally extend from a first side 730a of the support carrier 130 into the support carrier 130. The first side 730a of the support carrier 130 faces the semiconductor carrier 102, i.e. faces the vertically integrated electronic structures 104, 114 of each of the electronic devices 100. The support carrier is thinned (also referred to as grinding) from a second side 730b of the support carrier 130 opposite the first side to laterally separate support carrier regions 130a, 130b of the support carrier 130 via the at least one trench structure 730.

According to various embodiments, the at least one trench structure 730 may be formed into the support carrier 130 before the semiconductor carrier 102 is mounted to the support carrier 130. This process flow may be similar to the process flow described with reference to FIGS. 6A to 6F, wherein the differences are described in the following with reference to FIGS. 8A to 8F in schematic cross-sectional views.

Figure 8A:
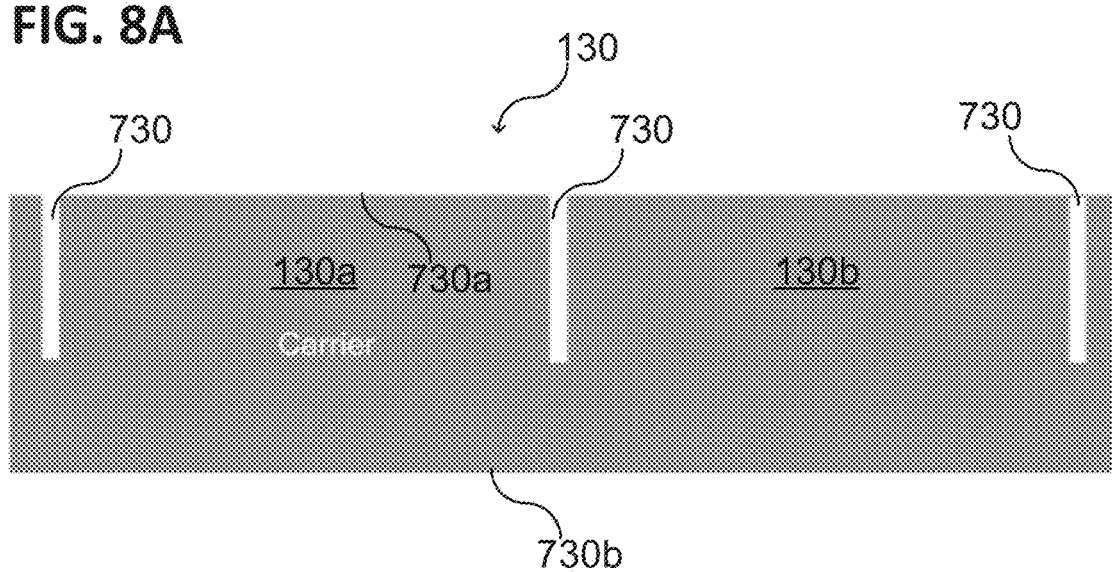
FIGS. 8A to 8H respectively show an electrostatic discharge protection device at various stages during manufacturing in a schematic cross-sectional view, according to various embodiments.

As illustrated in FIG. 8A, at least one trench structure 730 is formed into the support carrier 130, e.g. via etching. The at least one trench structure 730 may defined support carrier regions 130a, 130b disposed laterally next to each other. The support carrier regions 130a, 130b may respectively remain part of the electronic device 100 processed on the support carrier 130.

Figure 8B:
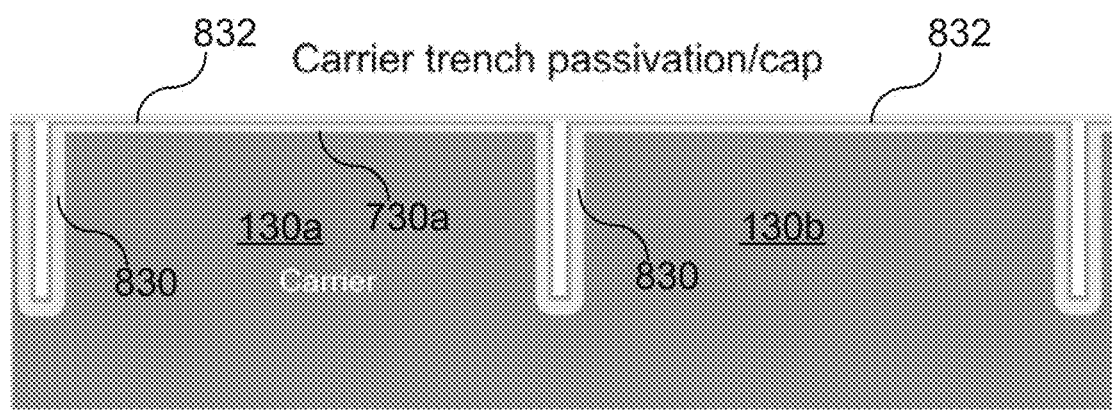

As illustrated in FIG. 8B, the at least one trench structure 730 may be at least partially filled with an electrically insulating material 830, e.g. with an oxide or a nitride. According to various embodiments, a first side 730a of the support carrier 130 may be covered with a cap layer 832. According to various embodiments, the first side 730a of the support carrier 130 and the at least one trench structure 730 may be passivated by one or more layers 830, 832, e.g. oxide and/or nitride layers. The at least one trench structure may laterally surround one or more support carrier regions 130a, 130b. The electrically insulating material may provide a sidewall passivation laterally surrounding the support carrier regions.

Figure 8C:
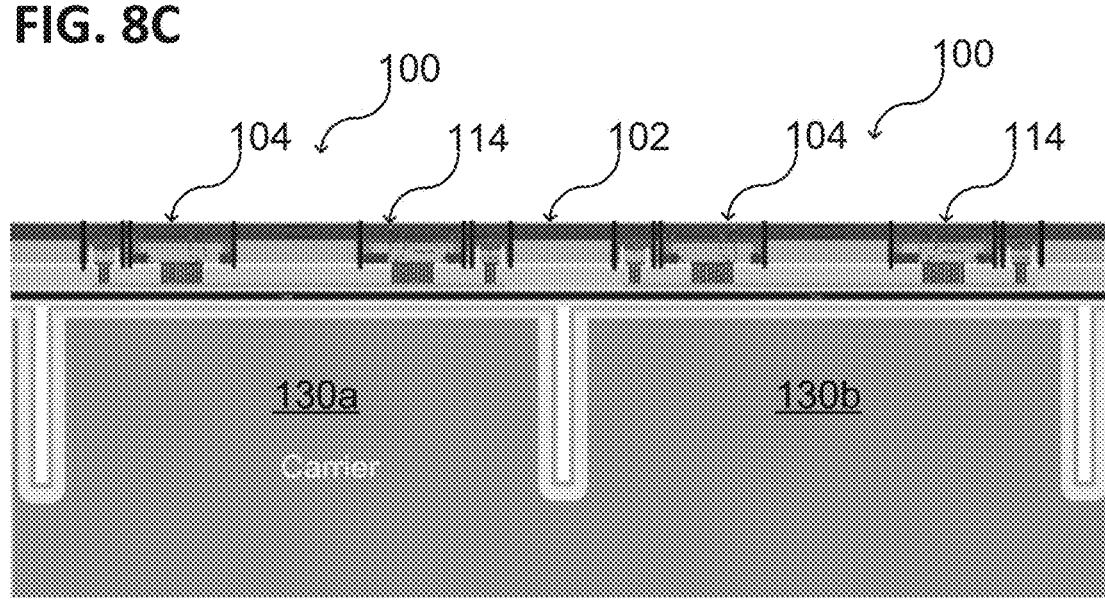

As illustrated in FIG. 8C, the semiconductor carrier 102 may be mounted to the support carrier 130 so that the first vertically integrated electronic structure 104 and the second vertically integrated electronic structure 114 are disposed vertically over respectively one of the support carrier regions 130a, 130b. Illustratively, each of the electronic devices 100 may be arranged over a corresponding support carrier region 130a, 130b.

Figure 8D:
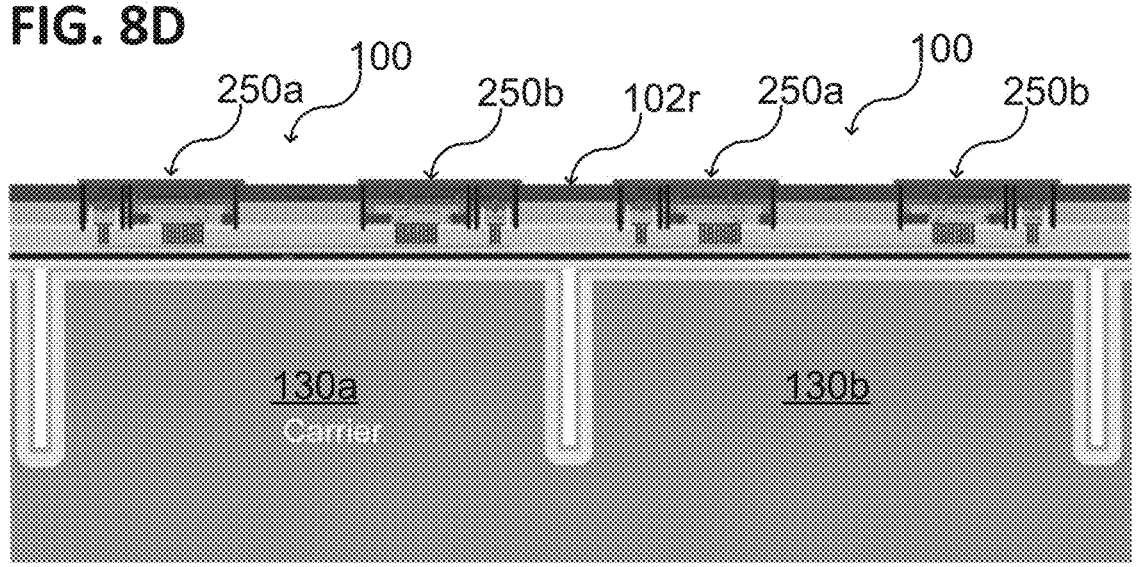
Figure 8E:
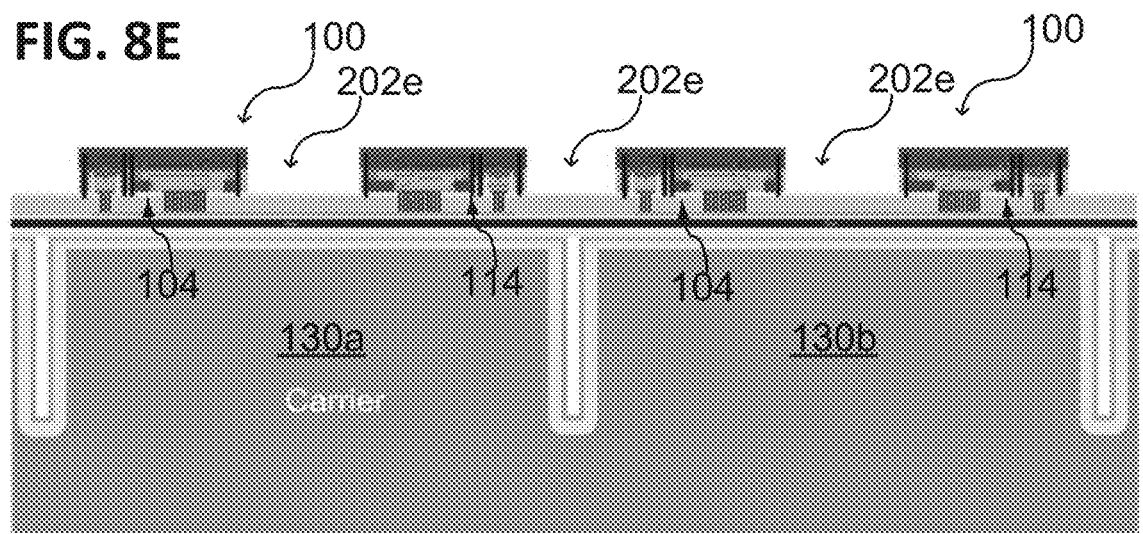

As illustrated in FIG. 8D, a patterned seed layer 250a, 250b may be formed at the second side 102r of the semiconductor carrier 102, as already described. As illustrated in FIG. 8E, semiconductor material of the semiconductor carrier 102 may be removed (e.g. via an etch process, e.g. via reactive ion etching) in the exposed portions 202e, as already described. According to various embodiments, the semiconductor material of the semiconductor carrier 102 may be removed between each of the vertically integrated electronic structures 104, 114 of the one or more electronic devices 100.

Figure 8F:
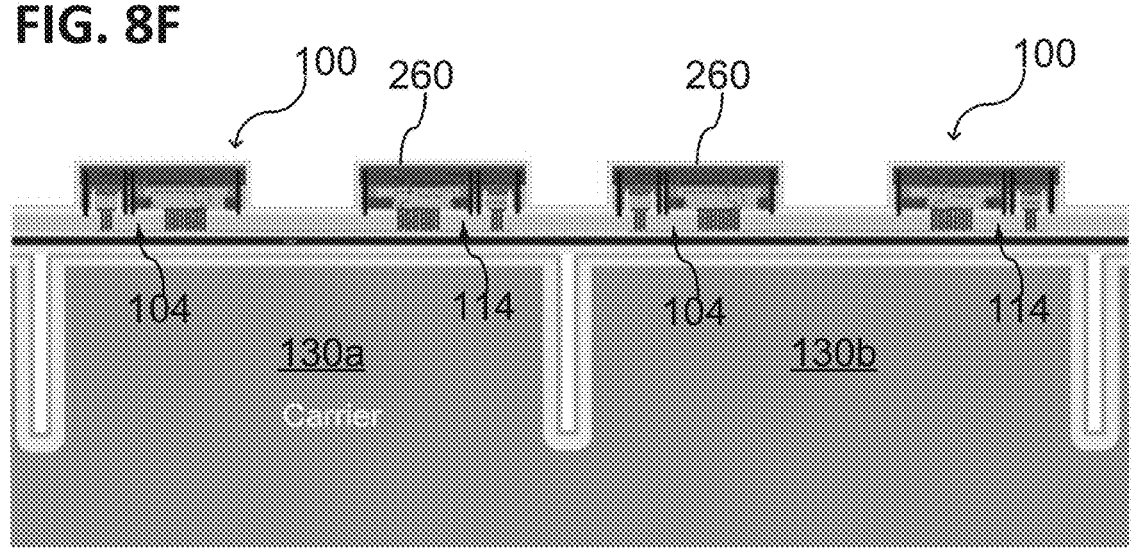

As illustrated in FIG. 8F, a sidewall passivation layer 260 may be formed, as already described. The sidewall passivation layer 260 may laterally surround each of the vertically integrated electronic structures 104, 114 of the one or more electronic devices 100.

Figure 8G:
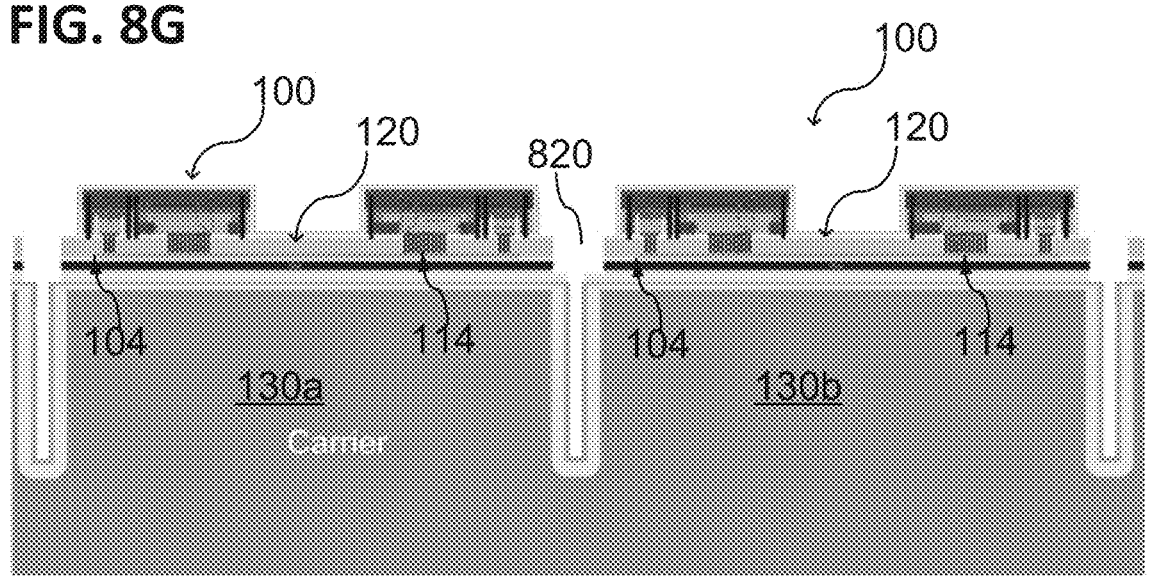
Figure 8H:
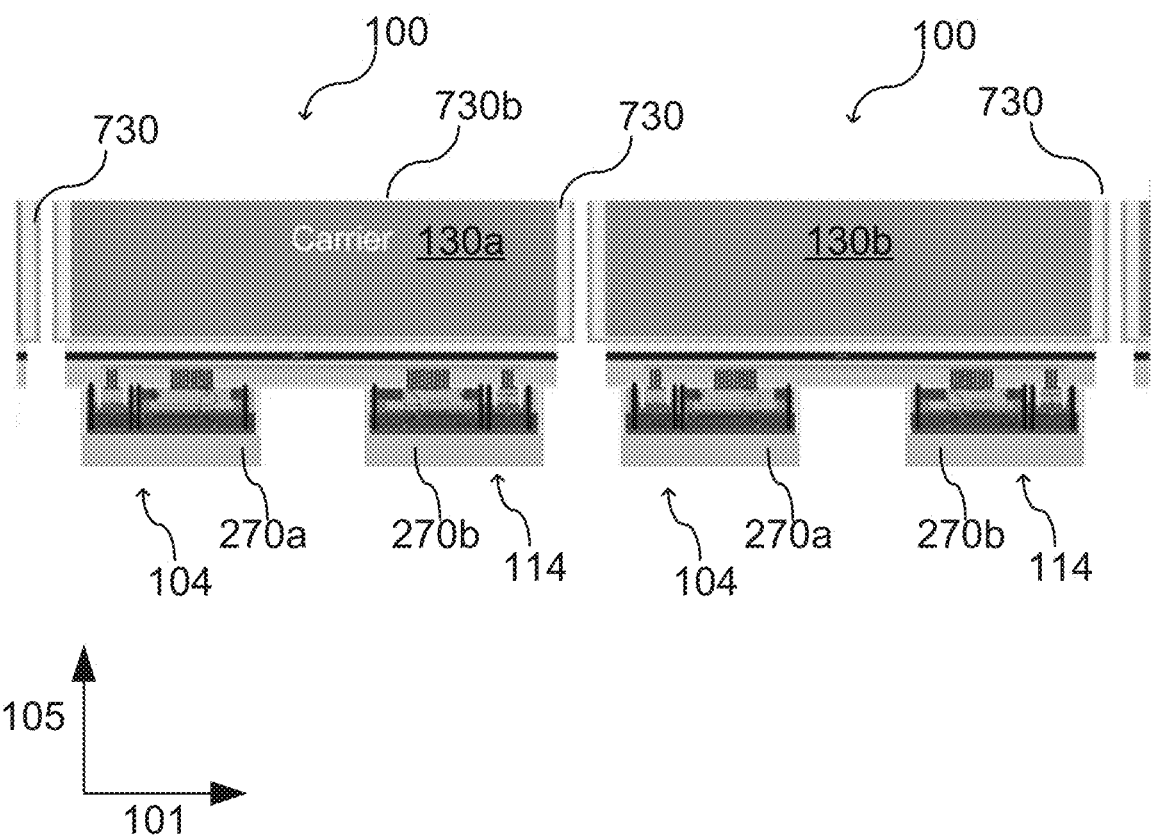

As illustrated in FIG. 8G, the electrical connection layer 120 may be partially removed in regions 820 between the adjacent electronic devices 100. Illustratively, the electrical connection layer 120 may be separated in accordance with the respective electronic device 100.

As illustrated in FIG. 811, contact pads 270a, 270b may be formed on the patterned seed layer 250a, 250b for each of the vertically integrated electronic structures 104, 114, e.g. via an electroless plating process, as already described. Further, the support carrier 130 is diced by grinding the backside 730b of the support carrier 130 down to the at least one trench structure 730.

According to various embodiments, the carrier arrangement including the semiconductor carrier 102 and the support carrier 130 may be singulated into a plurality of electronic devices 100. Each of the electronic devices 100 may include the vertically integrated electronic structures 104, 114 disposed on the respective portion of the electrical connection layer 120 and supported (e.g. mounted or bonded as described herein) by the respective portion 130a, 130b of support carrier 130.

According to various embodiments, the at least one trench structure 730 may be formed into the support carrier 130 before the semiconductor carrier 102 is mounted to the support carrier 130. If the semiconductor carrier 102 has a layer structure, various diodes may be formed by patterning the semiconductor carrier 102. The at least one trench structure 730 may define the positions for patterning the semiconductor carrier 102. In this case, the semiconductor carrier 102 may not need a specific alignment relative the support carrier 130. Illustratively, the semiconductor portions of the electronic devices 100 may be defined by the position of the at least one trench structure 730. This process flow may be similar to the process flow described with reference to FIGS. 8A to 8H, wherein the differences are described in the following with reference to FIGS. 9A to 9H in schematic cross-sectional views.

Figure 9A:
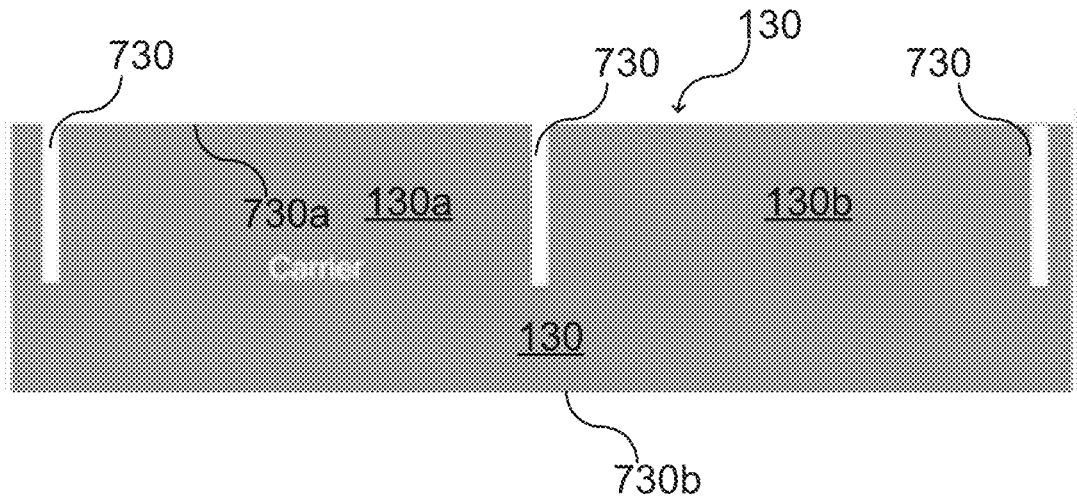
Figure 9B:
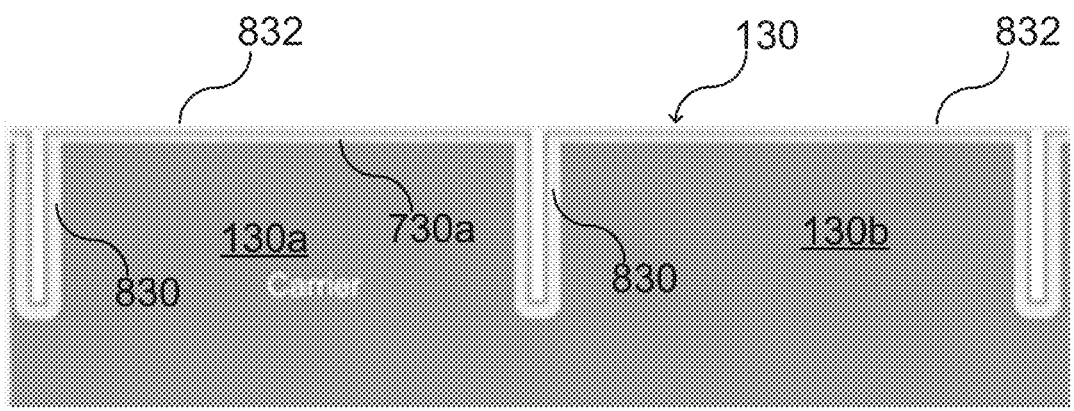

As illustrated in FIG. 9A and FIG. 9B, at least one trench structure 730 is formed in the support carrier 130. The first side 730a of the support carrier 130 and the at least one trench structure 730 may be passivated by one or more passivation layers 830, 832, e.g. oxide and/or nitride layers, as described above.

Figure 9C:
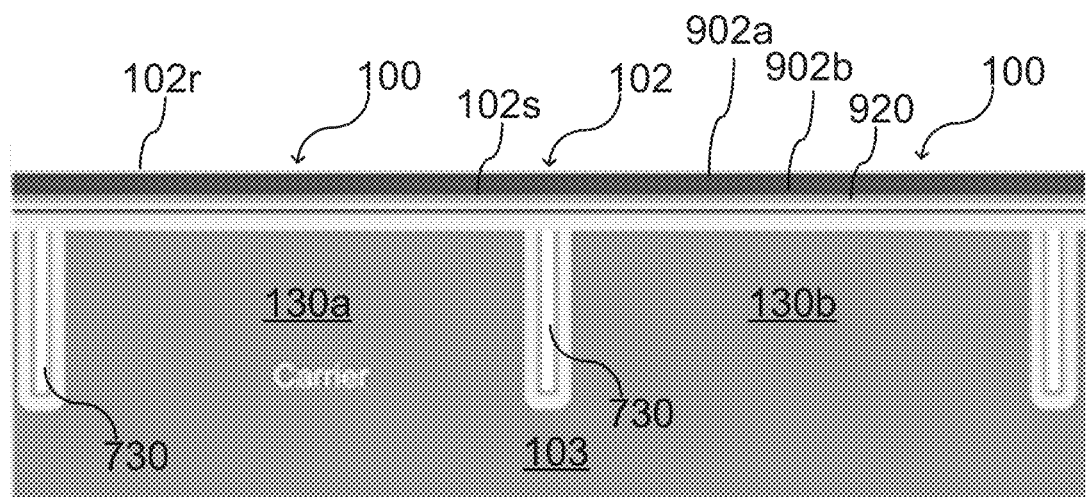

As illustrated in FIG. 9C, the semiconductor carrier 102 may be mounted to the support carrier 130 and thinned to a desired thickness. The lateral positions of the vertically integrated electronic structures of the semiconductor carrier 102 may not be defined by the semiconductor carrier 102, i.e. the structure of the semiconductor carrier 102 may be homogeneous along the lateral direction. The semiconductor carrier 102 may include for example two layers 902a, 902b (or more than two layers, e.g. three or four layers of different doing types and/or doping concentrations) of opposite doping type arranged over each other. According to various embodiments, an unstructured wafer 102 may be mounted on the support carrier 130. The electrical connection layer 920 disposed on the first side 102s of the semiconductor carrier 102 may be a single (e.g. an unstructured) metal layer, e.g. an aluminum layer, a copper layer, or an Al/Cu layer.

As illustrated in FIG. 9D, the semiconductor carrier 102 may be structured by forming a patterned seed layer 250a, 250b at the second side 102r of the semiconductor carrier 102 and by removing material of the semiconductor carrier 102 to laterally separate semiconductor portions of the semiconductor carrier 102, as already described. The patterned seed layer 250a, 250b may define one or more vertically integrated electronic structures 104, 114 in the semiconductor carrier 102. According to various embodiments, the semiconductor material of the semiconductor carrier 102 may be removed between each of the vertically integrated electronic structures 104, 114 of the one or more electronic devices 100.

As illustrated in FIG. 9E, the electrical connection layer 920 may be partially removed in regions 820 between the adjacent electronic devices 100. Illustratively, the electrical connection layer 920 may be separated in accordance with the respective electronic device 100.

As illustrated in FIG. 9F, a (e.g. sidewall) passivation layer 960 may be formed over the second side 102r of the semiconductor carrier 102, according to various embodiments. The passivation layer 960 may cover each of the vertically integrated electronic structures 104, 114 of the one or more electronic devices 100. The passivation layer 960 may include or may consist of carbon. The passivation layer 960 may include more than one material, e.g. a carbon layer and an oxide layer, and the like.

Figure 9G:
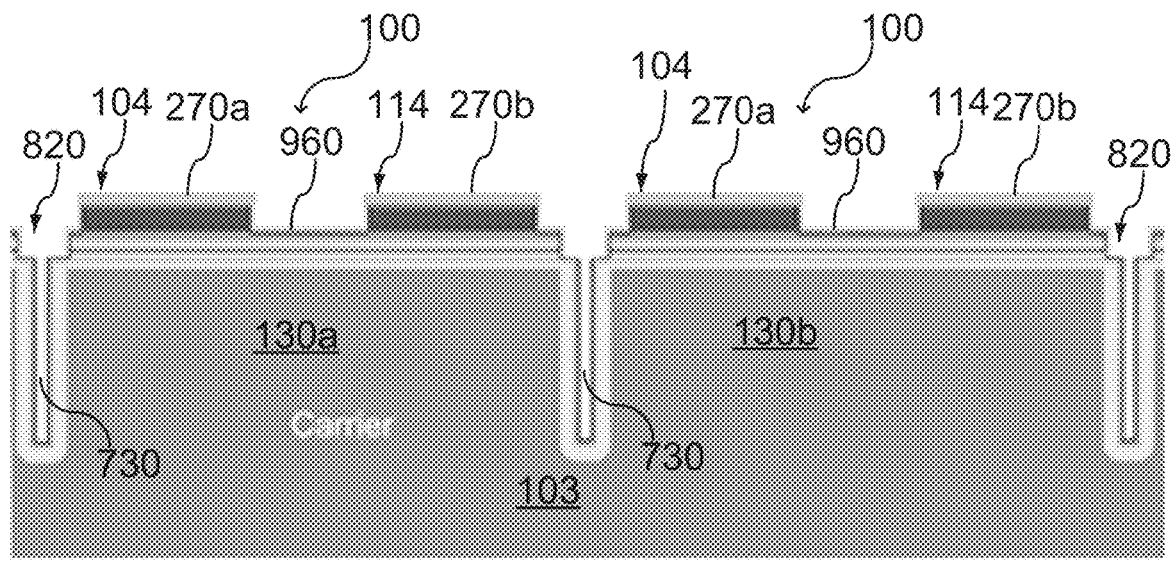

As illustrated in FIG. 9G, the portions of the patterned seed layer 250a, 250b may be exposed by partially removing the passivation layer 960. Subsequently, the contact pads 270a, 270b may be formed on the patterned seed layer 250a, 250b for each of the vertically integrated electronic structures 104, 114, e.g. via an electroless plating process, as already described.

Figure 9H:
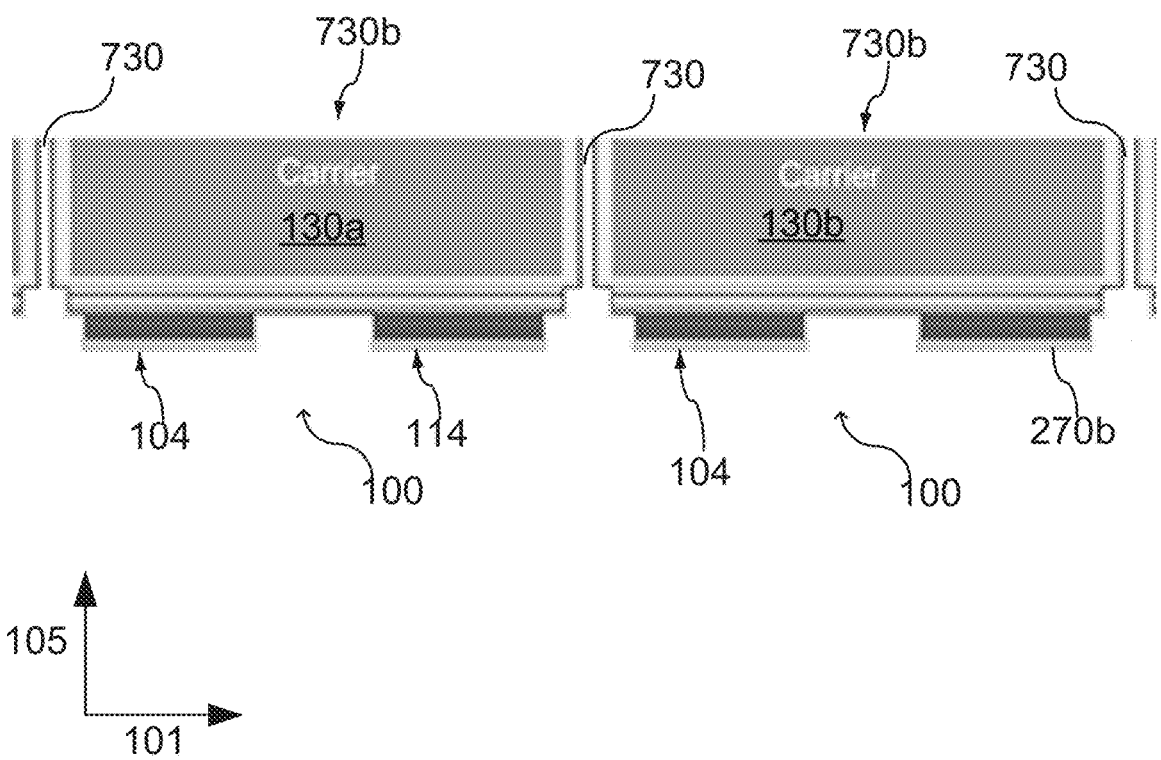

As illustrated in FIG. 9H, the support carrier 130 may be diced, e.g. by grinding the backside 730b of the support carrier 130 down to the at least one trench structure 730, as already described.

Figure 10:
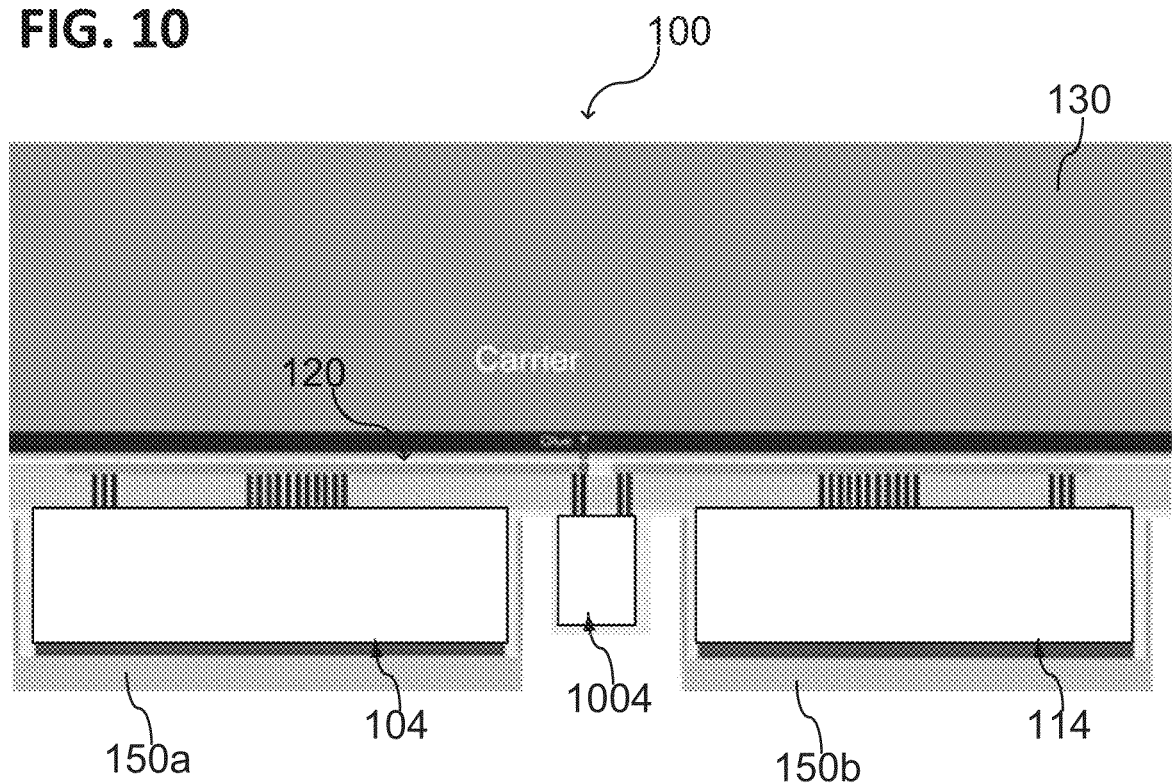
FIG. 10 shows an electrostatic discharge protection device in a schematic cross-sectional view, according to various embodiments.
Figure 10:
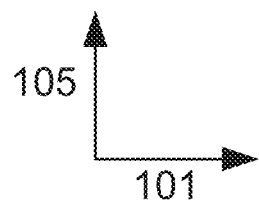

As illustrated in FIG. 10 in a schematic cross-sectional view, according to various embodiments, at least one lateral electronic structure 1004 may be formed between the vertically integrated electronic structures 104, 114. The least one lateral electronic structure 1004 may be formed or may be disposed on the electrical connection layer 120. The electrical connection layer 120 may be configured to electrically conductively connect the vertically integrated electronic structures 104, 114 with each other in series. According to various embodiments, the at least one lateral electronic structure 1004 may be coupled in series with the vertically integrated electronic structures 104, 114 as well. Illustratively, the at least one lateral electronic structure 1004 may be coupled between the vertically integrated electronic structures 104, 114. The at least one lateral electronic structure 1004 may be laterally spaced apart from the vertically integrated electronic structures 104, 114. The electrical connection layer 120 may be at least partially exposed in regions between the vertically integrated electronic structures 104, 114. The at least one lateral electronic structure 1004 may be only contacted by the electrical connection layer 120. Alternatively, the region between the vertically integrated electronic structures 104, 114 may be free of any further electronic structure.

Various examples are provided in the following that are embodied as described with reference to the figures or similar to the embodiments described above.

Example 1 is a method for manufacturing an electrostatic discharge protection device 100, the method including: providing a semiconductor carrier, the semiconductor carrier including a first vertical ESD protection structure and a second vertical ESD protection structure laterally spaced apart from each other, wherein an electrical connection layer is disposed over a first side of the semiconductor carrier electrically connecting (e.g. electrically conductively connecting) the first vertical ESD protection structure and the second vertical ESD protection structure with each other; mounting the semiconductor carrier on a support carrier, wherein the first side of the semiconductor carrier faces the support carrier; thinning the semiconductor carrier from a second side of the semiconductor carrier opposite the first side; removing material of the semiconductor carrier in a separation region between the first vertical ESD protection structure and the second vertical ESD protection structure to separate a first semiconductor region of the first vertical ESD protection structure from a second semiconductor region of the second vertical ESD protection structure with the first vertical ESD protection structure and the second vertical ESD protection structure remaining electrically connected with each other via the electrical connection layer.

In Example 2 the method of Example 1 may optionally include that the electrical connection layer includes at least one first via embedded in dielectric material electrically contacting at least one first contact region of the first vertical ESD protection structure and that the electrical connection layer includes at least one second via for electrically contacting at least one second contact region of the second vertical ESD protection structure.

In Example 3 the method of Example 2 may optionally include that the at least one first contact region and the at least one second contact region include a highly doped semiconductor material.

In Example 4 the method of any one of Examples 1 to 3 may optionally include that the electrical connection layer includes one or more metal lines embedded in dielectric material. The one or more metal lines laterally electrically connecting (e.g. electrically conductively connecting) the first vertical ESD protection structure and the second vertical ESD protection structure with each other.

In Example 5 the method of any one of Examples 1 to 4 may optionally include that the electrical connection layer is at least partially exposed by removing the material of the semiconductor carrier in the separation region.

In Example 6 the method of any one of Examples 1 to 5 may optionally include that mounting the semiconductor carrier on the support carrier includes adhering the electrical connection layer to the support carrier via an adhesive layer. Alternatively, the method of any one of Examples 1 to 5 may optionally include that mounting the semiconductor carrier on the support carrier includes bonding the electrical connection layer to the support carrier via an adhesive layer. Therefore, the electrical connection layer may include a silicon oxide layer that may be connected to the support carrier 130 by direct bonding, e.g. bonding silicon to silicon or bonding silicon oxide to silicon oxide.

In Example 7 the method of any one of Examples 1 to 6 may optionally include that thinning the semiconductor carrier includes polishing the semiconductor carrier from the second side to remove material of the semiconductor carrier.

In Example 8 the method of any one of Examples 1 to 7 may optionally include that thinning the semiconductor carrier includes reducing a thickness of the semiconductor carrier to less than 15 μm.

In Example 9 the method of any one of Examples 1 to 8 may optionally include that removing the material of the semiconductor carrier in the separation region includes an etch process.

In Example 10 the method of any one of Examples 1 to 9 may optionally further include: after thinning the semiconductor carrier, forming a first contact structure disposed on the second side of the semiconductor carrier to electrically contact the first vertical ESD protection structure and forming a second contact structure disposed on the second side of the semiconductor carrier to electrically contact the second vertical ESD protection structure.

In Example 11 the method of Example 10 may optionally include that, after removing the material of the semiconductor carrier in the separation region, the first contact structure contacts the first semiconductor region of the first vertical ESD protection structure and that the second contact structure contacts the second semiconductor region of the second vertical ESD protection structure.

In Example 12 the method of Example 11 may optionally include that the first contact structure has substantially the same lateral extension as the first semiconductor region of the first vertical ESD protection structure and that the second contact structure has substantially the same lateral extension as the second semiconductor region of the second vertical ESD protection structure.

In Example 13 the method of any one of Examples 1 to 12 may optionally further include: after removing the material of the semiconductor carrier in the separation region, forming a first passivation structure laterally surrounding the first semiconductor region of the first vertical ESD protection structure and forming a second passivation structure laterally surrounding the second semiconductor region of the second vertical ESD protection structure.

In Example 14 the method of any one of Examples 1 to 13 may optionally include that the support carrier includes at least one trench structure laterally surrounding a support carrier region. The semiconductor carrier is mounted to the support carrier so that the first vertical ESD protection structure and the second vertical ESD protection structure are disposed vertically over the support carrier region.

In Example 15 the method of Example 14 may optionally include that the at least one trench structure extends from a first side of the support carrier into the support carrier. The first side of the support carrier faces the semiconductor carrier, and the support carrier is thinned from a second side of the support carrier opposite the first side to laterally separate the support carrier region via the at least one trench structure.

In Example 16 the method of Example 14 or 15 may optionally include that the at least one trench structure includes at least one trench that is at least partially filled with an electrically insulating material.

Example 17 is a method for manufacturing an electronic device, the method including: providing a semiconductor carrier, the semiconductor carrier including a first vertically integrated electronic structure and a second vertically integrated electronic structure laterally spaced apart from each other, an electrical connection layer disposed over a first side of the semiconductor carrier electrically connecting (e.g. electrically conductively connecting) the first vertically integrated electronic structure and the second vertically integrated electronic structure with each other; mounting the semiconductor carrier on a support carrier, wherein the first side of the semiconductor carrier faces the support carrier; thinning the semiconductor carrier from a second side of the semiconductor carrier opposite the first side; removing material of the semiconductor carrier in a separation region between the first vertically integrated electronic structure and the second vertically integrated electronic structure to separate a first semiconductor region of the first vertically integrated electronic structure from a second semiconductor region of the second vertically integrated electronic structure. The first vertically integrated electronic structure and the second vertically integrated electronic structure remaining electrically connected with each other via the electrical connection layer.

In Example 18 the method of Example 17 may optionally include that the electrical connection layer includes at least one first via embedded in dielectric material electrically contacting at least one first contact region of the first vertically integrated electronic structure and that the electrical connection layer includes at least one second via for electrically contacting at least one second contact region of the second vertically integrated electronic structure.

In Example 19 the method of Example 18 may optionally include that the at least one first contact region and the at least one second contact region include a highly doped semiconductor material.

In Example 20 the method of any one of Examples 17 to 19 may optionally include that the electrical connection layer includes one or more metal lines embedded in dielectric material, the one or more metal lines laterally electrically connecting (e.g. electrically conductively connecting) the first vertically integrated electronic structure and the second vertically integrated electronic structure with each other.

In Example 21 the method of any one of Examples 17 to 20 may optionally include that the electrical connection layer is at least partially exposed by removing the material of the semiconductor carrier in the separation region.

In Example 22 the method of any one of Examples 17 to 21 may optionally include that mounting the semiconductor carrier on the support carrier includes adhering the electrical connection layer to the support carrier via an adhesive layer. Alternatively, the method of any one of Examples 17 to 21 may optionally include that mounting the semiconductor carrier on the support carrier includes bonding the semiconductor carrier 102 to the support carrier via an additional layer. Therefore, the electrical connection layer may include doped silicon for electrical current transport and the additional layer for bonding the semiconductor carrier 102 to the support carrier 130. The additional layer may include silicon or silicon oxide to provide a direct bonding with the support carrier 130. In this case, the support carrier 130 may also include silicon or silicon oxide.

In Example 23 the method of any one of Examples 17 to 22 may optionally include that thinning the semiconductor carrier includes polishing the semiconductor carrier from the second side to remove material of the semiconductor carrier.

In Example 24 the method of any one of Examples 17 to 23 may optionally include that thinning the semiconductor carrier includes reducing a thickness of the semiconductor carrier to less than 15 µm.

In Example 25 the method of any one of Examples 17 to 24 may optionally include that removing the material of the semiconductor carrier in the separation region includes an etch process.

In Example 26 the method of any one of Examples 17 to 25 may optionally further include: after thinning the semiconductor carrier, forming a first contact structure disposed on the second side of the semiconductor carrier to electrically contact the first vertically integrated electronic structure and forming a second contact structure disposed on the second side of the semiconductor carrier to electrically contact the second vertically integrated electronic structure.

In Example 27 the method of Example 26 may optionally include that, after removing the material of the semiconductor carrier in the separation region, the first contact structure contacts the first semiconductor region of the first vertically integrated electronic structure and the second contact structure contacts the second semiconductor region of the second vertically integrated electronic structure.

In Example 28 the method of Example 27 may optionally include that the first contact structure has substantially the same lateral extension as the first semiconductor region of the first vertically integrated electronic structure and that the second contact structure has substantially the same lateral extension as the second semiconductor region of the second vertically integrated electronic structure.

In Example 29 the method of any one of Examples 17 to 28 may optionally further include: after removing the material of the semiconductor carrier in the separation region, forming a first passivation structure laterally surrounding the first semiconductor region of the first vertically integrated electronic structure and forming a second passivation structure laterally surrounding the second semiconductor region of the second vertically integrated electronic structure.

In Example 30 the method of any one of Examples 17 to 29 may optionally include that the support carrier includes at least one trench structure laterally surrounding a support carrier region. The semiconductor carrier is mounted to the support carrier so that the first vertically integrated electronic structure and the second vertically integrated electronic structure are disposed vertically over the support carrier region.

In Example 31 the method of Example 30 may optionally include that the at least one trench structure extends from a first side of the support carrier into the support carrier. The first side of the support carrier faces the semiconductor carrier. The support carrier is thinned from a second side of the support carrier opposite the first side to laterally separate the support carrier region via the at least one trench structure.

In Example 32 the method of Example 30 or 31 may optionally include that the at least one trench structure includes at least one trench that is at least partially filled with an electrically insulating material.

In Example 33 the method of Example 32 may optionally include that the electrically insulating material provides a sidewall passivation laterally surrounding the support carrier region.

Example 34 is a method for processing a semiconductor carrier, the method including: providing a semiconductor carrier, the semiconductor carrier including a plurality of chip regions and chip separation regions laterally surrounding each of the plurality of chip regions, a first vertically integrated electronic structure and a second vertically integrated electronic structure are disposed in each of the plurality of chip regions, an electrical connection layer is disposed over a first side of the semiconductor carrier, wherein the respective first vertically integrated electronic structure and second vertically integrated electronic structure of the corresponding chip region are connected with each other via the electrical connection layer; providing a support carrier, wherein the support carrier includes at least one trench structure extending from a first side of the support carrier into the support carrier and laterally surrounding a plurality of support carrier regions respectively; mounting the semiconductor carrier on the support carrier, wherein the first side of the semiconductor carrier faces the first side of the support carrier and the plurality of chip regions are vertically aligned with the plurality of support carrier regions; thinning the semiconductor carrier from a second side of the semiconductor carrier opposite the first side of the semiconductor carrier; removing material of the semiconductor carrier in separation regions between the first vertically integrated electronic structures and second vertically integrated electronic structures respectively to laterally separate a first semiconductor region of the first vertically integrated electronic structure from a second semiconductor region of the second vertically integrated electronic structure in each of the chip regions; removing material of the semiconductor carrier in the chip separation regions to laterally separate the plurality of chip regions from each other; removing material of the electrical connection layer between the chip regions to separate a respective electrical connection layer portion for each of the chip regions; thinning the support carrier from a second side of the support carrier opposite the first side of the support carrier to laterally separate each of the plurality of support carrier regions via the at least one trench structure. This may allow to singulate the plurality of support carrier regions from each other with the first vertically integrated electronic structure and second vertically integrated electronic structure respectively mounted on each of the singulated support carrier regions.

Example 35 is an electrostatic discharge protection device including: a first vertically integrated ESD protection structure including a first semiconductor portion, a first contact region disposed on a first side of the first semiconductor portion and a first terminal exposed on a second side of the first semiconductor portion opposite the first side of the first semiconductor portion, a second vertically integrated ESD protection structure including a second semiconductor portion, a second contact region disposed on a first side of the second semiconductor portion and a second terminal exposed on a second side of the second semiconductor portion opposite the first side of the second semiconductor portion, an electrical connection layer, the first vertically integrated ESD protection structure and the second vertically integrated ESD protection structure are disposed on the electrical connection layer laterally separated from each other, the electrical connection layer includes at least one first via embedded in dielectric material contacting the first contact region and at least one second via embedded in dielectric material contacting the second contact region, the electrical connection layer further including at least one metal line electrically connecting (e.g. electrically conductively connecting) the least one first via and the least one second via with each other; the electrical connection layer is mounted on a support carrier via at least one adhesive layer. Alternatively, Example 35 is an electrostatic discharge protection device including: a first vertically integrated ESD protection structure including a first semiconductor portion, a first contact region disposed on a first side of the first semiconductor portion and a first terminal exposed on a second side of the first semiconductor portion opposite the first side of the first semiconductor portion, a second vertically integrated ESD protection structure including a second semiconductor portion, a second contact region disposed on a first side of the second semiconductor portion and a second terminal exposed on a second side of the second semiconductor portion opposite the first side of the second semiconductor portion, an electrical connection layer, the first vertically integrated ESD protection structure and the second vertically integrated ESD protection structure are disposed on the electrical connection layer laterally separated from each other and electrically connected (e.g. electrically conductively connecting) with each other via the electrical connection layer; the electrical connection layer is mounted on a support carrier via at least one adhesive layer.

In Example 36 the electrostatic discharge protection device of Example 35 may optionally include that a region between the first vertically integrated ESD protection structure and the second vertically integrated ESD protection structure is free of semiconductor material.

In Example 37 the electrostatic discharge protection device of Example 35 may optionally include that a region between the first vertically integrated ESD protection structure and the second vertically integrated ESD protection structure is free of solid material.

In Example 38 the electrostatic discharge protection device of any one of Examples 35 to 37 may optionally include that the electrical connection layer is partially exposed in a region between the first vertically integrated ESD protection structure and the second vertically integrated ESD protection structure.

In Example 39 the electrostatic discharge protection device of any one of Examples 35 to 38 may optionally include that first semiconductor portion is configured as at least one of the following: a vertically integrated diode, a vertically integrated transistor, and a vertically integrated thyristor.

In Example 40 the electrostatic discharge protection device of Example 39 may optionally include that the second semiconductor portion is configured as at least one of the following: a vertically integrated diode, a vertically integrated transistor, and a vertically integrated thyristor.

In Example 41 the electrostatic discharge protection device of any one of Examples 35 to 40 may optionally include that the first semiconductor portion has a thickness of less than 15 µm.

In Example 42 the electrostatic discharge protection device of any one of Examples 35 to 41 may optionally include that the second semiconductor portion has a thickness of less than 15 µm.

In Example 43 the electrostatic discharge protection device of any one of Examples 35 to 42 may optionally further include: an isolation structure laterally surrounding the first semiconductor portion and the second semiconductor portion respectively.

In Example 44 the electrostatic discharge protection device of any one of Examples 35 to 43 may optionally include that the first terminal has substantially the same lateral extension as the first semiconductor portion.

In Example 45 the electrostatic discharge protection device of any one of Examples 35 to 44 may optionally include that the second terminal has substantially the same lateral extension as the second semiconductor portion.

In Example 46 the electrostatic discharge protection device of any one of Examples 35 to 45 may optionally include that the respective semiconductor portion is a silicon portion.

In Example 47 the electrostatic discharge protection device of any one of Examples 35 to 46 may optionally include that the carrier is electrically isolated from the first ESD protection structure and from the second ESD protection structure.

In Example 48 the electrostatic discharge protection device of any one of Examples 35 to 47 may optionally include that the first ESD protection structure includes at least two ESD protection structure elements in an anti-parallel arrangement.

In Example 49 the electrostatic discharge protection device of any one of Examples 35 to 48 may optionally include that the second ESD protection structure includes at least two ESD protection structure elements in an anti-parallel arrangement.

In Example 50 the electrostatic discharge protection device of any one of Examples 35 to 49 may optionally include that the first ESD protection structure and the second ESD protection structure are in an anti-serial arrangement. The first ESD protection structure may include at least one first ESD protection structure element and the second ESD protection structure may include at least one second ESD protection structure element, wherein the first ESD protection structure element and the second ESD protection structure element are in an anti-serial arrangement. The first ESD protection structure element and the second ESD protection structure element may be from the same type, e.g. a diode-type, a transistor-type, a thyristor-type, and the like.

In Example 51 the electrostatic discharge protection device of any one of Examples 35 to 50 may optionally include that the first ESD protection structure includes at least one first thyristor structure and that the second ESD protection structure includes at least one second thyristor structure coupled via the electrical connection layer in an anti-serial arrangement.

In Example 52 the electrostatic discharge protection device of Example 51 may optionally include that the first ESD protection structure further includes at least one first diode structure coupled with the first thyristor structure in an anti-parallel arrangement and that the second ESD protection structure further includes at least one second diode structure coupled with the second thyristor structure in an anti-parallel arrangement, the at least one first diode structure and the at least one second diode structure coupled via the electrical connection layer in an anti-serial arrangement.

In Example 53 the electrostatic discharge protection device of any one of Examples 35 to 50 may optionally include that the first electrostatic discharge protection structure includes at least one first electrical short and a first thyristor structure in a parallel arrangement and that the second electrostatic discharge protection structure includes at least one second electrical short and a second thyristor structure in a parallel arrangement, the at least one first electrical short and the second thyristor structure coupled in series via the electrical connection layer and the at least one second electrical short and the first thyristor structure coupled in series via the electrical connection layer.

Example 54 is an electronic device including: an electronic circuit; an electrostatic discharge protection device according to any one of claims 35 to 53 coupled with the electronic circuit via the first terminal and the second terminal to protect the electronic circuit from an electrostatic discharge event.

Example 55 is a method for manufacturing an electronic device, the method including: providing a semiconductor carrier, the semiconductor carrier including a first vertically integrated electronic structure and a second vertically integrated electronic structure laterally spaced apart from each other, an electrical connection layer disposed over a first side of the semiconductor carrier electrically connecting (e.g. electrically conductively connecting) the first vertically integrated electronic structure and the second vertically integrated electronic structure with each other; mounting the semiconductor carrier on a support carrier, wherein the first side of the semiconductor carrier faces the support carrier; thinning the semiconductor carrier from a second side of the semiconductor carrier opposite the first side of the semiconductor carrier; removing material of the semiconductor carrier in a region between the first vertically integrated electronic structure and the second vertically integrated electronic structure to partially expose the electrical connection layer.

Example 56 is a method for manufacturing an electronic device, the method including: providing a semiconductor carrier, the semiconductor carrier including a first vertically integrated electronic structure and a second vertically integrated electronic structure laterally spaced apart from each other, an electrical connection layer disposed over a first side of the semiconductor carrier electrically connecting (e.g. electrically conductively connecting) the first vertically integrated electronic structure and the second vertically integrated electronic structure with each other; mounting the semiconductor carrier on a support carrier, wherein the first side of the semiconductor carrier faces the support carrier; thinning the semiconductor carrier from a second side of the semiconductor carrier opposite the first side of the semiconductor carrier; subsequently, forming a patterned seed layer at the second side of the semiconductor carrier, wherein exposed portions of the semiconductor carrier between the first vertically integrated electronic structure and the second vertically integrated electronic structure are free of the patterned seed layer; removing material of the semiconductor carrier in the exposed portions, forming a sidewall passivation layer laterally surrounding the first vertically integrated electronic structure and the second vertically integrated electronic structure respectively, forming a first contact pad on the patterned seed layer via an electroless plating process, the first contact pad electrically contacting the first vertically integrated electronic structure, and forming a second contact pad on the patterned seed layer via an electroless plating process, the second contact pad electrically contacting the second vertically integrated electronic structure.

According to various embodiments, the vertically integrated electronic structures 104, 114 may be coupled in serial via the electrical connection layer, e.g. via a metallization layer. If the vertically integrated electronic structures 104, 114 have a polarity, e.g. including a diode and/or a thyristor, the vertically integrated electronic structures 104, 114 may be coupled in an anti-serial arrangement via the electrical connection layer, e.g. via a metallization layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An electrostatic discharge protection device comprising:
a first vertically integrated electrostatic discharge protection structure comprising a first semiconductor portion, a first contact region disposed on a first side of the first semiconductor portion and a first terminal exposed on a second side of the first semiconductor portion opposite the first side of the first semiconductor portion;
a second vertically integrated electrostatic discharge protection structure comprising a second semiconductor portion, a second contact region disposed on a first side of the second semiconductor portion and a second terminal exposed on a second side of the second semiconductor portion opposite the first side of the second semiconductor portion;
an electrical connection layer, wherein the first vertically integrated electrostatic discharge protection structure and the second vertically integrated electrostatic discharge protection structure are disposed on the electrical connection layer laterally separated from each other and are electrically connected with each other via the electrical connection layer;
wherein the electrical connection layer is mounted on a support carrier.

2. The electrostatic discharge protection device of claim 1, wherein the electrical connection layer is partially exposed in a region between the first vertically integrated electrostatic discharge protection structure and the second vertically integrated electrostatic discharge protection structure.

3. The electrostatic discharge protection device of claim 1, wherein the first semiconductor portion has a thickness of less than 15 μm and wherein the second semiconductor portion has a thickness of less than 15 μm.

4. The electrostatic discharge protection device of claim 1, further comprising:
a passivation structure laterally surrounding the first semiconductor portion and the second semiconductor portion respectively.

5. The electrostatic discharge protection device of claim 1, wherein the first terminal has substantially the same lateral extension as the first semiconductor portion and wherein the second terminal has substantially the same lateral extension as the second semiconductor portion.

6. The electrostatic discharge protection device of claim 2, wherein the first electrostatic discharge protection structure comprises at least two electrostatic discharge protection structure elements in an anti-parallel arrangement and wherein the second electrostatic discharge protection structure comprises at least two electrostatic discharge protection structure elements in an anti-parallel arrangement.

7. The electrostatic discharge protection device of claim 1, wherein the first electrostatic discharge protection structure comprises at least one first diode structure and a first thyristor structure in an anti-parallel arrangement, wherein the second electrostatic discharge protection structure comprises at least one second diode structure and a second thyristor structure in an anti-parallel arrangement;
wherein the at least one first diode structure and the at least one second diode structure are coupled via the electrical connection layer in an anti-serial arrangement, and wherein the at least one first thyristor structure and the at least one second thyristor structure are coupled via the electrical connection layer in an anti-serial arrangement.

8. The electrostatic discharge protection device of claim 1, wherein a region between the first vertically integrated electrostatic discharge protection structure and the second vertically integrated electrostatic discharge protection structure is free of semiconductor material.

9. The electrostatic discharge protection device of claim 1, wherein a region between the first vertically integrated electrostatic discharge protection structure and the second vertically integrated electrostatic discharge protection structure is free of solid material.

10. The electrostatic discharge protection device of claim 1, wherein the first semiconductor portion is configured as at least one of the following: a vertically integrated diode, a vertically integrated transistor, and a vertically integrated thyristor.

11. The electrostatic discharge protection device of claim 1, wherein the second semiconductor portion is configured as at least one of the following: a vertically integrated diode, a vertically integrated transistor, and a vertically integrated thyristor.

12. The electrostatic discharge protection device of claim 1, wherein the support carrier is electrically isolated from the first electrostatic discharge protection structure and from the second electrostatic discharge protection structure.

13. The electrostatic discharge protection device of claim 1, wherein the first electrostatic discharge protection structure comprises at least one first thyristor structure and wherein the second electrostatic discharge protection structure comprises at least one second thyristor structure coupled via the electrical connection layer in an anti-serial arrangement.

14. The electrostatic discharge protection device of claim 13, wherein the first electrostatic discharge protection structure further comprises at least one first diode structure coupled with the first thyristor structure in an anti-parallel arrangement and wherein the second electrostatic discharge protection structure further comprises at least one second diode structure coupled with the second thyristor structure in an anti-parallel arrangement, the at least one first diode structure and the at least one second diode structure coupled via the electrical connection layer in an anti-serial arrangement.

15. The electrostatic discharge protection device of claim 1, wherein the first electrostatic discharge protection structure comprises at least one first electrical short and a first thyristor structure in a parallel arrangement and wherein the second electrostatic discharge protection structure comprises at least one second electrical short and a second thyristor structure in a parallel arrangement, the at least one first electrical short and the second thyristor structure coupled in series via the electrical connection layer and the at least one second electrical short and the first thyristor structure coupled in series via the electrical connection layer.

16. An electrostatic discharge protection device comprising:
   a first vertically integrated electrostatic discharge protection structure comprising a first semiconductor portion, a first contact region disposed on a first side of the first semiconductor portion and a first terminal exposed on a second side of the first semiconductor portion opposite the first side of the first semiconductor portion;
   a second vertically integrated electrostatic discharge protection structure comprising a second semiconductor portion, a second contact region disposed on a first side of the second semiconductor portion and a second terminal exposed on a second side of the second semiconductor portion opposite the first side of the second semiconductor portion;
   an electrical connection layer, wherein the first vertically integrated electrostatic discharge protection structure and the second vertically integrated electrostatic discharge protection structure are disposed on the electrical connection layer laterally separated from each other;
   wherein the first electrostatic discharge protection structure comprises at least one first electrical short and a first electrostatic discharge protection device in a parallel arrangement and wherein the second electrostatic discharge protection structure comprises at least one second electrical short and a second electrostatic discharge protection device in a parallel arrangement, wherein the at least one first electrical short and the second electrostatic discharge protection device are coupled in series via the electrical connection layer and wherein the at least one second electrical short and the first electrostatic discharge protection device are coupled in series via the electrical connection layer.

17. The electrostatic discharge protection device of claim 16, wherein the first and the second electrostatic protection devices respectively comprise at least one pn-junction.

18. The electrostatic discharge protection device of claim 16, wherein the first and the second electrical shorts provide an electrical connection between the respective terminal and the electrical connection layer.

\* \* \* \* \*